United States Patent
Takagi et al.

(10) Patent No.: US 7,151,629 B2
(45) Date of Patent: Dec. 19, 2006

(54) THREE-DIMENSIONAL PHOTONIC CRYSTAL AND OPTICAL DEVICE INCLUDING THE SAME

(75) Inventors: Akinari Takagi, Yokosuka (JP); Hikaru Hoshi, Yokohama (JP); Kiyokatsu Ikemoto, Yokohama (JP); Kazuya Nobayashi, Edogawa-ku (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/402,555

(22) Filed: Apr. 11, 2006

(65) Prior Publication Data

US 2006/0262385 A1    Nov. 23, 2006

(30) Foreign Application Priority Data

May 18, 2005   (JP) .............................. 2005-145630

(51) Int. Cl.
*G02F 1/00*     (2006.01)
(52) U.S. Cl. ..................... 359/321; 359/322; 430/315
(58) Field of Classification Search ............... 359/321, 359/322, 238; 430/315, 320, 329
See application file for complete search history.

(56) References Cited

U.S. PATENT DOCUMENTS

| 5,335,240 A | 8/1994 | Ho |
| 5,406,573 A | 4/1995 | Ozbay |
| 5,784,400 A | 7/1998 | Joannopoulos et al. |
| 6,597,851 B1 | 7/2003 | Johnson |

OTHER PUBLICATIONS

Eli Yablonovitch, Inhibited Spontaneous Emission in Solid-State Physics and Electronics, Physical Review Letters, vol. 58, 1987, pp. 2059-2062.
Susumu Noda; et al., Trapping and Emission of Photons by a Single Defect in a Photonic Bandgap Structure, Nature, vol. 407, 2000, pp. 608-610.

*Primary Examiner*—Timothy Thompson
(74) *Attorney, Agent, or Firm*—Canon U.S.A., Inc. Intellectual Property Division

(57) ABSTRACT

A three-dimensional photonic crystal includes a first region including a first layer, a second layer, a third layer, a fourth layer and a second region including the first layer, the second layer, the third layer, the fourth layer, and additional layers including discrete structures spaced from each other. The horizontal interval and the vertical interval of the rod-shaped structures in the first region are the same as those of the rod-shaped structures in the second region, respectively.

18 Claims, 20 Drawing Sheets

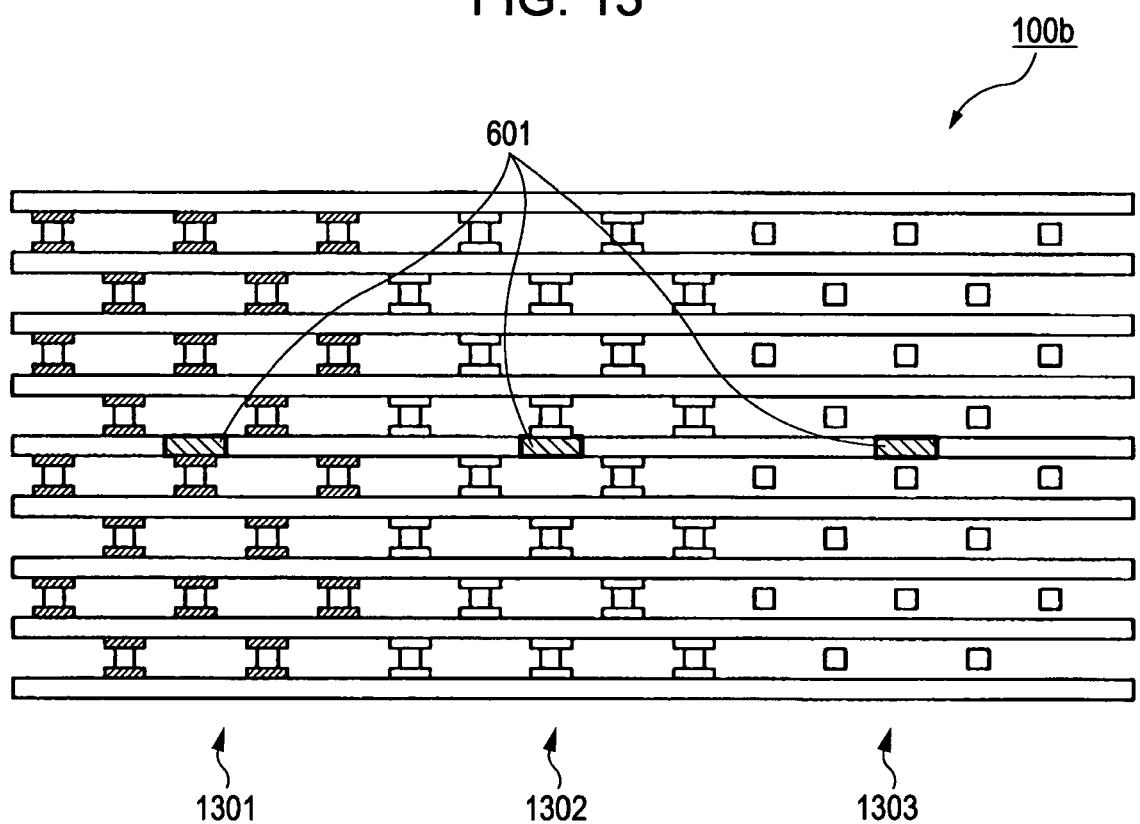

1501  1502  1503

λ1  λ2  λn

DIAMOND OPAL STRUCTURE

WOOD-PILE STRUCTURE

SPIRAL STRUCTURE

UNIQUE STRUCTURE

INVERSE STRUCTURE

THREE-DIMENSIONAL PHOTONIC CRYSTAL AND OPTICAL DEVICE INCLUDING THE SAME

BACKGROUND OF THE INVENTION

1. Field of the Invention

The present invention relates to three-dimensional photonic crystals operating at a plurality of wavelengths. The present invention particularly relates to a three-dimensional photonic crystal which has a point defect serving as a resonator and/or a linear defect serving as a waveguide and which operates at desired wavelengths and also relates to an optical device including such a three-dimensional photonic crystal.

2. Description of the Related Art

Yablonovitch has introduced the idea of controlling the transmission and reflection of electromagnetic waves using fine structures having dimensions smaller than the wavelengths thereof (*Physical Review Letters*, Vol. 58, pp. 2059 (1987)). That is, the transmission and reflection of an electromagnetic wave can be controlled with an array of the fine structures. If the wavelength of the electromagnetic wave is as short as the wavelength of light, the transmission and reflection of light can be controlled with the fine structures. Materials having the fine structures are known as photonic crystals. A reflecting mirror that has a reflectivity of 100%, that is, no optical loss, over a certain range of wavelengths can be probably prepared using a photonic crystal. Such a range of wavelengths is referred to as "photonic band gap (PBG)" analogous to the energy gap of known semiconductors. A three-dimensional periodic fine structure has a photonic band gap in which light cannot propagate in any direction. Such a photonic band gap is hereinafter referred to as "complete photonic band gap". Structures with a complete photonic band gap can be used for various applications, for example, the control of the spontaneous emission of light. This leads to the possibility of novel functional devices. Thus, there is an increasing demand for functional devices having structures with complete photonic band gaps over a wide wavelength range.

U.S. Pat. No. 5,335,240 and 6,597,851 disclose some structures with photonic band gaps. Examples of a three-dimensional periodic structure include structures shown in FIGS. 25A to 25E. FIGS. 25A, 25B, 25C, 25D, and 25E show a diamond opal structure, a wood-pile structure, a spiral structure, a unique three-dimensional structure, and a structure inverse to the three-dimensional structure, respectively.

If a defect is formed in a periodic fine structure with a photonic band gap, the periodic fine structure can be used as a resonator or waveguide for emitting or guiding, respectively, light with a desired wavelength. If the defect is point-shaped or linear, the periodic fine structure serves as a point-defect resonator or a linear defect waveguide. Such a point-defect resonator with a photonic band gap can confine light in a small region of space; hence, a light-emitting device including the point-defect resonator can emit light with any wavelength with high efficiency and the light emission of the light-emitting device can be precisely controlled. As discussed in U.S. Pat. No. 5,784,400, laser oscillation can be achieved in such a manner that a point defect is formed in a periodic structure and then filled with a luminous material and light is emitted from the luminous material using an excitation unit.

U.S. Pat. No. 5,406,573 and other documents disclose various methods for manufacturing photonic crystals.

Photonic band gaps can be controlled by varying the grating periods of photonic crystals. An increase in grating period shifts a photonic band gap to longer wavelengths and a decrease in grating period shifts a photonic band gap to shorter wavelengths.

*Nature*, vol. 407, p. 608 (2000) reports that the operating wavelength of an optical add/drop multiplexer (an optical add/drop circuit) including a two-dimensional photonic crystal is controlled by varying the grating period. The optical add/drop multiplexer is an optical input/output circuit that adds a new wavelength to a medium in which a plurality of wavelengths propagate or that removes (drops) a specific wavelength from such a medium. Small-sized optical add/drop multiplexers can probably be manufactured using photonic crystals. *Nature*, vol. 407, p. 608 (2000) also reports that substantially equal drop efficiencies can be achieved for a plurality of wavelengths in such a manner that a waveguide and a resonator are tuned to desired operating wavelengths by varying the grating period of the two-dimensional photonic crystal. A two-dimensional photonic crystal with different grating periods is referred to as an in-plane hetero photonic crystal and is a good example showing that the control of a photonic band gap is a key to develop an optical nanodevice including a photonic crystal.

Structures with different grating periods cannot be directly applied to three-dimensional photonic crystals. A photonic band gap of a three-dimensional photonic crystal can be controlled by varying the grating period thereof. This causes structural displacement between regions with different grating periods as illustrated in FIG. 26. In three-dimensional structures, structural displacement occurs in the X-, Y-, and Z-axis directions; hence, the manufacture of three-dimensional structures with no structural displacements is difficult. In a layer-by-layer structure including stacked layers with a wood-pile structure, the grating period thereof varies in the stacking direction of the layers. Therefore, it is difficult to manufacture such a layer-by-layer structure by the following conventional processes: a wafer fusion process, a nanoimprinting process, and a process in which layers patterned by electron beam lithography are stacked.

SUMMARY OF THE INVENTION

At least one exemplary embodiment is directed to a three-dimensional photonic crystal operating at a plurality of wavelengths. A photonic band gap of the three-dimensional photonic crystal can be adjusted to a desired wavelength without varying the grating period thereof.

A three-dimensional photonic crystal, exhibiting photonic band gaps, according to at least one exemplary embodiment includes a first region, including a first layer, a second layer, a third layer and a fourth layer, and a second region, including the first layer, the second layer, the third layer, the fourth layer and additional layers including discrete structures spaced from each other. The first to fourth layers can be arranged in that order. The first to fourth layers include a plurality of rod-shaped structures arranged at a predetermined interval. The rod-shaped structures included in the first and third layers extend in the same direction. The rod-shaped structures included in the second and fourth layers extend in the same direction. The longitudinal direction of the rod-shaped structures included in the first and third layers is different from that of the rod-shaped structures included in the second and fourth layers. The rod-shaped structures included in the first layer are displaced by half of the predetermined interval from those included in the third layer in the direction perpendicular to the direction in which those included in the first and third layers extend. The rod-shaped structures included in the second layer are displaced by half of the predetermined interval from those included in the fourth layer in the direction perpendicular to the direction in which those included in the second and fourth layers extend. The additional layers in the second region are disposed between the first to fourth layers in parallel to the first to fourth layers. The discrete structures can be located at positions corresponding to the intersections of the rod-shaped structures included in the first to fourth layers. The horizontal interval and the vertical interval of the rod-shaped structures in the first region are the same as those of the rod-shaped structures in the second region, respectively.

An optical device according to at least one exemplary embodiment includes a three-dimensional photonic crystal in accordance with at least one exemplary embodiment. The three-dimensional photonic crystal has a defect.

An optical device according to at least one exemplary embodiment serves as a color filter operating at a plurality of wavelengths and includes a three-dimensional photonic crystal according to at least one exemplary embodiment.

Further features of the present invention will become apparent from the following description of exemplary embodiments with reference to the attached drawings.

BRIEF DESCRIPTION OF THE DRAWINGS

FIG. 13 is a schematic view of a three-dimensional photonic crystal that is a modification of the photonic crystal of the second exemplary embodiment.

DESCRIPTION OF THE EMBODIMENTS

Figure 1A:
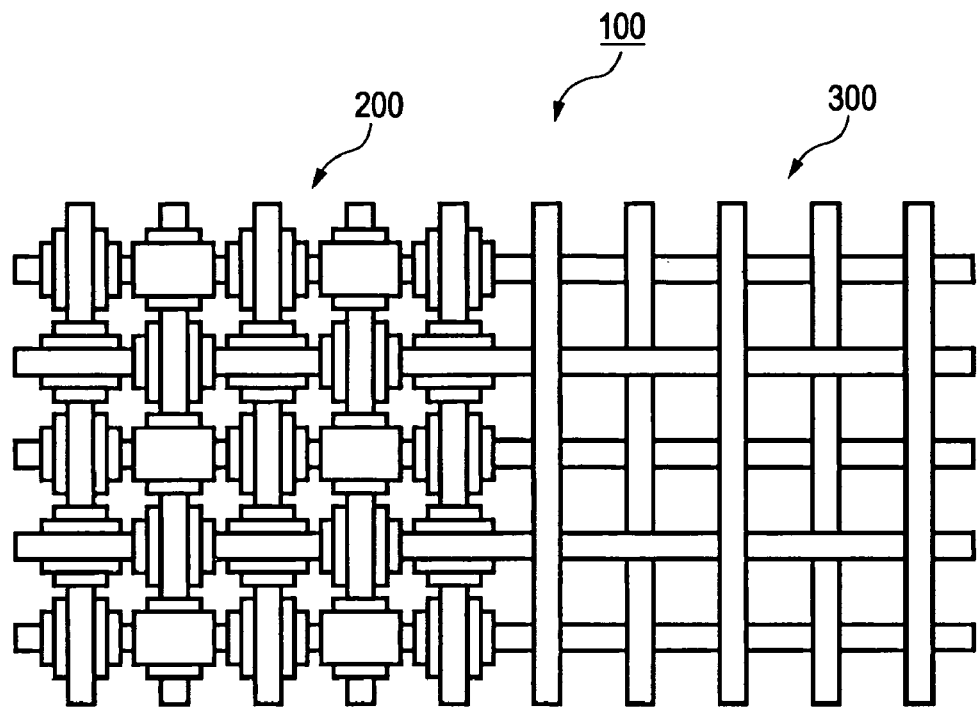
FIG. 1A is a top view of a photonic crystal according to a first exemplary embodiment of the present invention and FIG. 1B is a side view thereof.

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate, for example, the techniques of plasma and wet etching layers.

In all of the examples illustrated and discussed herein, any specific values, for example, the pitch, interval, and index of refraction values, should be interpreted to be illustrative only and non limiting. Thus, other examples of the exemplary embodiments could have different values.

Notice that similar reference numerals and letters refer to similar items in the following figures, and thus once an item is defined in one figure, it may not be discussed for following figures.

First Exemplary Embodiment

Figure 1B:
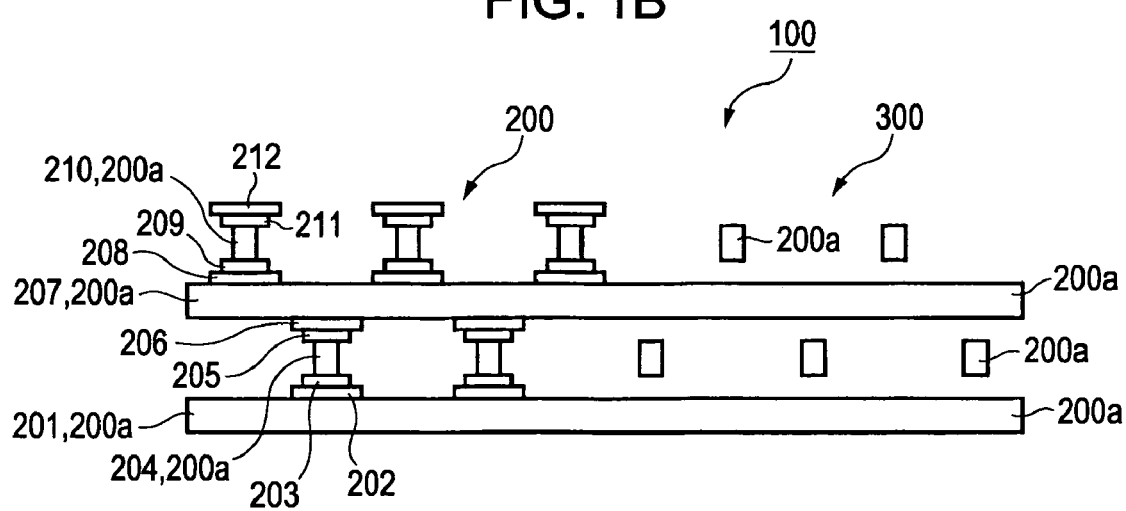

FIG. 1A illustrates the upper face of a photonic crystal 100 according to a first exemplary embodiment of the present invention. FIG. 1B shows a side face thereof. The photonic crystal 100 includes a first region 300 and a second region 200 as illustrated in FIGS. 1A and 1B. The first and second regions 300 and 200 have the same grating period but different photonic band gaps.

Figure 2A:
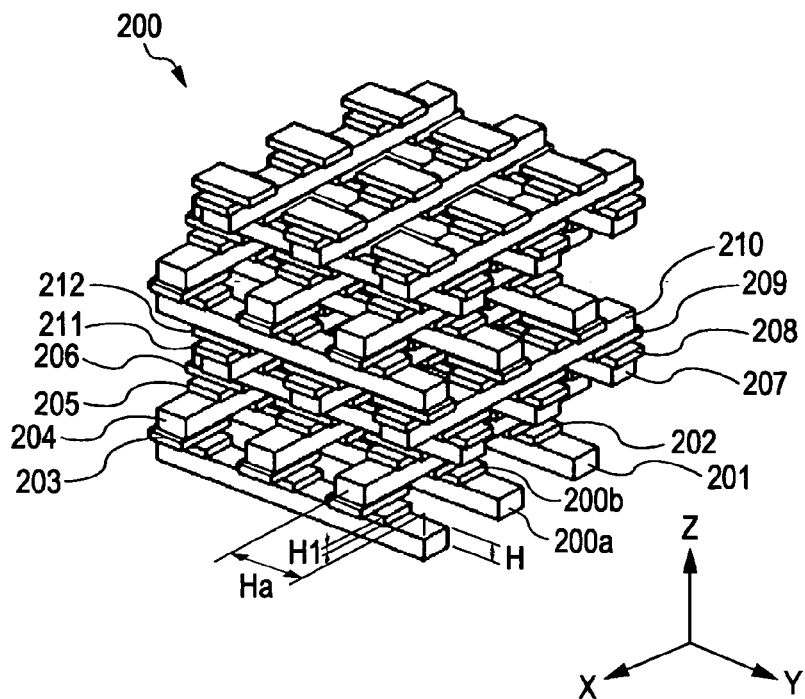
FIG. 2A is a perspective view of a second region included in the photonic crystal and FIG. 2B includes sectional views of first to twelfth layers included in the second region.
Figure 2B:
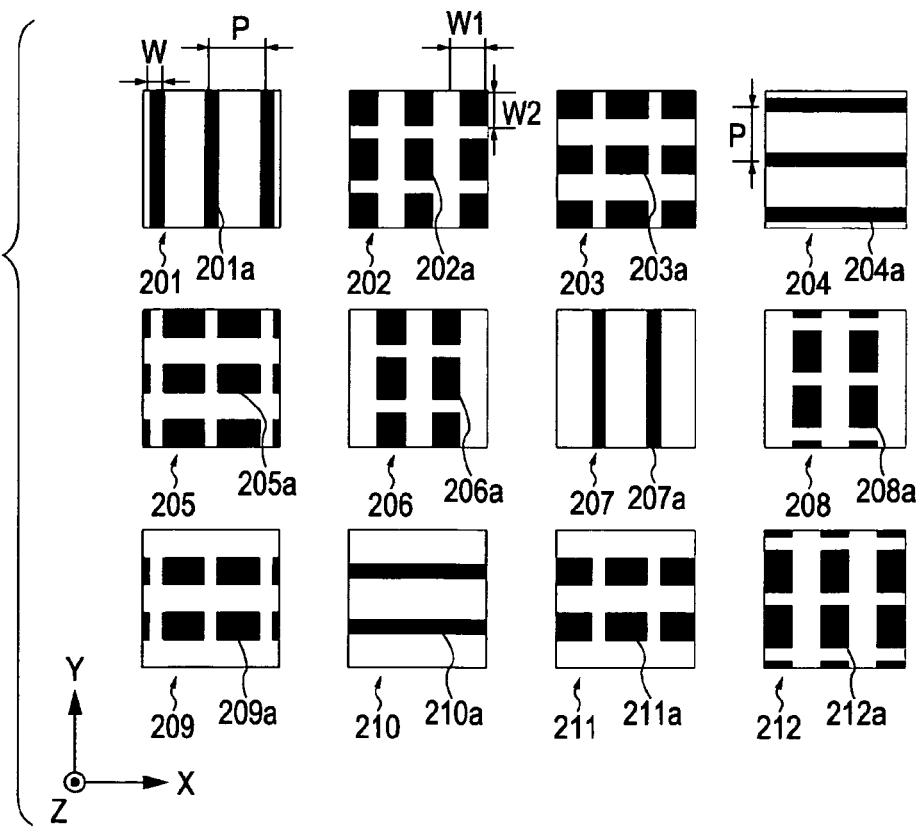

FIG. 2A illustrates the second region 200. With reference to FIG. 2A, the second region 200 includes 12 layers: a first layer 201 to twelfth layers 212 which can be arranged in that order in parallel to the X-Y plane in FIG. 2A and each of which include a plurality of periodic structures that are periodic units. FIG. 2B shows cross sections of the first to twelfth layers 201 to 212, the cross sections being parallel to the X-Y plane in FIG. 2B. With reference to FIG. 2A, the first and seventh layers 201 and 207 include a plurality of first rectangular rods 201a and seventh rectangular rods 207a, respectively, which extend in the Y-axis direction and which can be arrange at an equal interval in the X-axis direction. The first rectangular rods 201a are displaced by about P/2 from the seventh rectangular rods and 207a in the X-axis direction, wherein P represents the interval between the rod-shaped structures 200a arranged in each layer. The fourth and tenth layers 204 and 210 include a plurality of fourth rectangular rods 204a and tenth rectangular rods 210a, respectively, which extend in the X-axis direction and which can be arrange at the interval in the Y-axis direction. The fourth rectangular rods 204a are displaced by about P/2 from the tenth rectangular rods and 210a in the Y-axis direction. The second and third layers 202 and 203 include second rectangular blocks 202a and third rectangular blocks 203a, respectively, that are located at positions corresponding to the intersections of the first and fourth rectangular rods 201a and 204a when viewed in the stacking direction of these layers. The second rectangular blocks 202a are rotated 90 degrees from the third rectangular blocks 203a in the X-Y plane and can be symmetric to the third rectangular blocks 203a. The fifth and sixth layers 205 and 206 include fifth rectangular blocks 205a and sixth rectangular blocks 206a, respectively, located at positions corresponding to the intersections of the fourth and seventh rectangular rods 204a and 207a when viewed in the stacking direction of these layers. The eighth and ninth layers 208 and 209 include eighth rectangular blocks 208a and ninth rectangular blocks 209a, respectively, located at positions corresponding to the intersections of the seventh and tenth rectangular rods 207a and 210a when viewed in the stacking direction of these layers. The eleventh and twelfth layers 211 and 212 include eleventh rectangular blocks 211a and twelfth rectangular blocks 212a, respectively. The first, fourth, seventh, and tenth rectangular rods 201a, 204a, 207a, and 210a and other rectangular rods are generically referred to as rod-shaped structures 200a and the second, third, fifth, sixth, eighth, ninth, eleventh, and twelfth rectangular blocks 202a, 203a, 205a, 206a, 208a, 209a, 211a, and 212a are generically referred to as discrete structures 200b. The rod-shaped structures 200a and the discrete structures 200b can be in contact with each other or operatively connected in the stacking direction thereof and contain a first medium.

Figure 3:
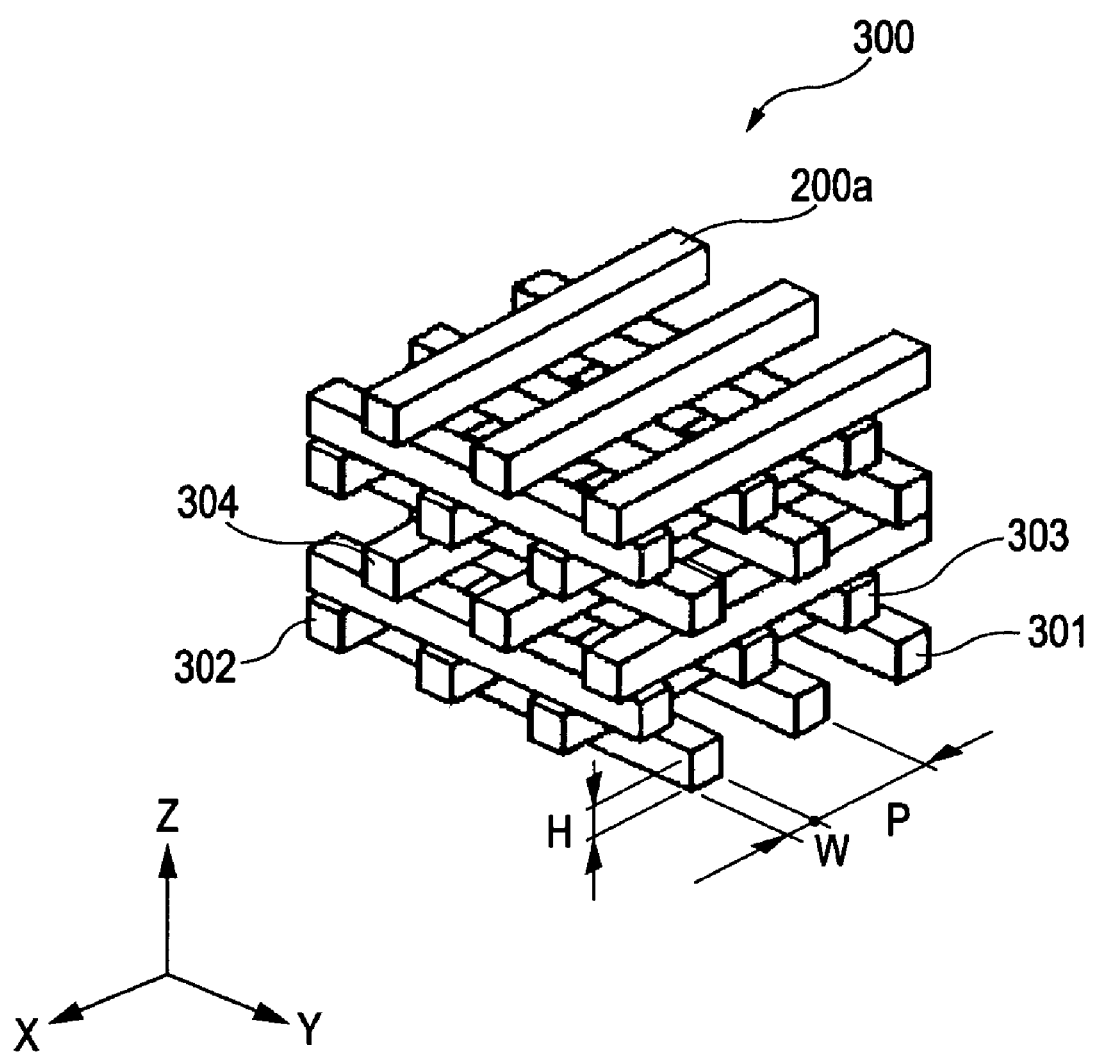
FIG. 3 is a perspective view of a first region included in the photonic crystal.

FIG. 3 illustrates the first region 300. With reference to FIG. 3, the first region 300 includes a thirteenth layer 301, a fourteenth layer 302, a fifteenth layer 303, and a sixteenth layer 304. The thirteenth and fifteenth layers 301 and 303 include the rod-shaped structures 200a, arranged at an interval, extending in the Y-axis direction. The fourteenth and sixteenth layers 302 and 304 include the rod-shaped structures 200a, arranged at an interval, extending the X-axis direction. The rod-shaped structures 200a included in the thirteenth layer 301 are displaced by about P/2 from those included in the fifteenth layer 303 in the X-axis direction. The rod-shaped structures 200a in the fourteenth layer 302 are displaced by about P/2 from those in the sixteenth layer 304 in the Y-axis direction. The thirteenth to sixteenth layer 301 to 304 can be stacked in the Z-axis direction and form stacked periodic units. With reference to FIG. 3, the first region 300 has two periodic units. In, the photonic crystal 100, portions other than the rod-shaped structures 200a and the discrete structures 200b can be filled with a second medium. The followings can be determined such that the photonic crystal 100 exhibits photonic band gaps at desired wavelengths: the refractive indices of the first and second media, the shapes of the rod-shaped and discrete structures 200a and 200b, the intervals between the rod-shaped and discrete structures 200a and 200b, and the thicknesses of the first to twelfth layers 201 to 212.

The horizontal interval and the vertical interval of the rod-shaped structures 200a in the first region 300 are about the same as those of the rod-shaped structures 200a in the second region 200, respectively.

The rod-shaped structures 200a extending in the second region 200 can have the same height as that of the rod-shaped structures 200a extending in the first region 300 or a height different from that of the rod-shaped structures 200a extending in the first region 300.

The rod-shaped structures 200a in the second region 200 can have the same width as that of the rod-shaped structures 200a in the first region 300 or a width different from that of the rod-shaped structures 200a in the first region 300.

Figure 4A:
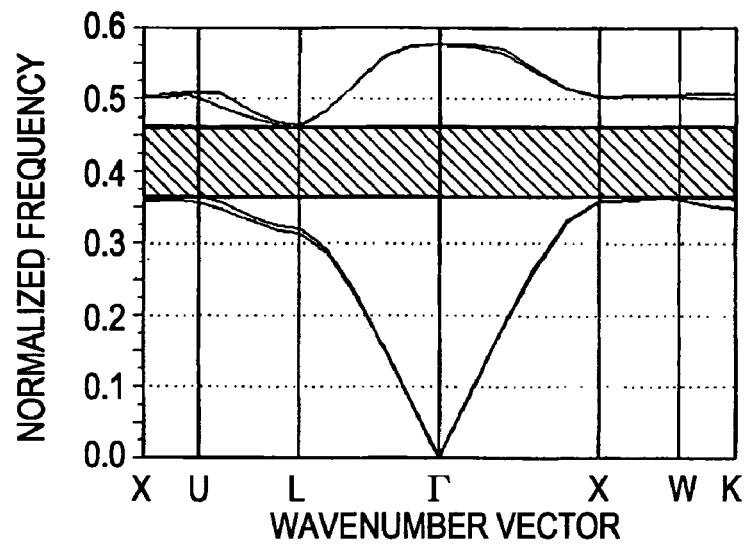
FIG. 4A is a graph showing a photonic band structure of the second region.
Figure 4B:
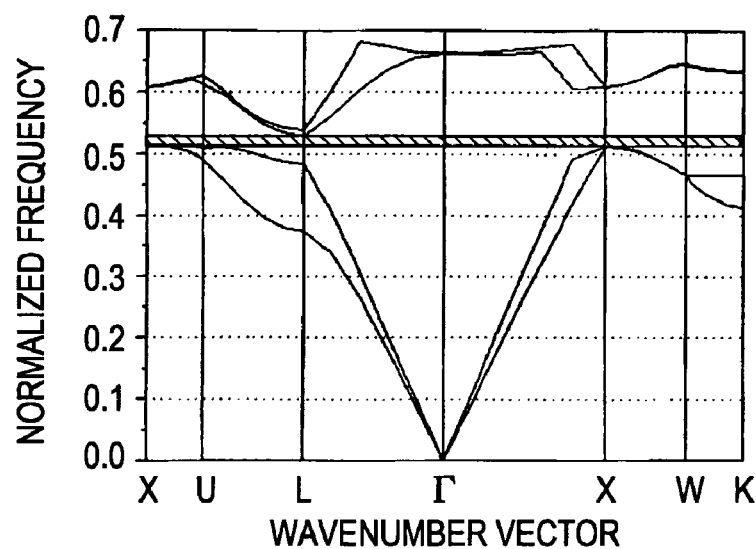
FIG. 4B is a graph showing a photonic band structure of the first region.

FIG. 4A shows a photonic band structure of the second region 200 and FIG. 4B show a photonic band structure of the first region 300. The first medium has a refractive index of about 3.309 and a second medium has a refractive index of about 1.0. The rod-shaped structures 200a have a width of about 0.24 P and a height of about 0.174 P. The discrete structures 200b have a height of about 0.09 P and rectangular faces, parallel to the X-Y plane in FIG. 2A, having a size of about 0.34 P×0.6 P.

With respect to FIG. 4A, the second region 200 exhibits a complete photonic band gap at a normalized frequency of 0.365 to 0.463, the normalized frequency being determined by dividing an angular frequency by P. With respect to FIG. 4B, the first region 300 exhibits a complete photonic band gap at a normalized frequency of 0.512 to 0.529. When P is 600 nm, the second region 200 exhibits a complete photonic band gap at a wavelength of 1,296 to 1,643 nm and the first region 300 exhibits a complete photonic band gap at a wavelength of 1,134 to 1,172 nm.

Since the second region 200 including the discrete structures 200b and the first region 300 including no discrete structures 200b are included in the photonic crystal 100, the photonic crystal 100 can exhibit such complete photonic band gaps in different wavelength ranges although the rod-shaped structures 200a can be arranged at the same interval in the first and second regions 300 and 200.

With reference to FIGS. 1B and 2A, two of the discrete structures 200b can be disposed between two of the rod-shaped structures 200a arranged in the Z-axis direction in FIG. 2A. If two or more of the discrete structures 200b are disposed between the two of the rod-shaped structures 200a, the photonic crystal 100 can exhibit complete photonic band gaps in wider wavelength ranges.

Figure 5A:
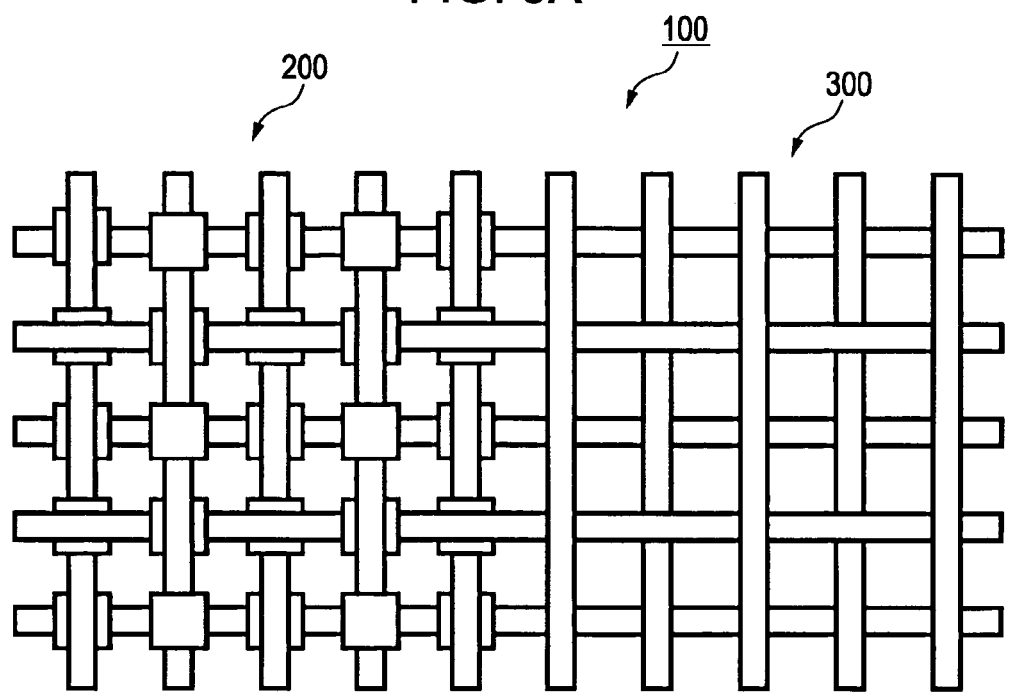
FIG. 5A is a top view of a photonic crystal that is a modification of the photonic crystal of the first exemplary embodiment and FIG. 5B is a side view thereof.
Figure 5B:
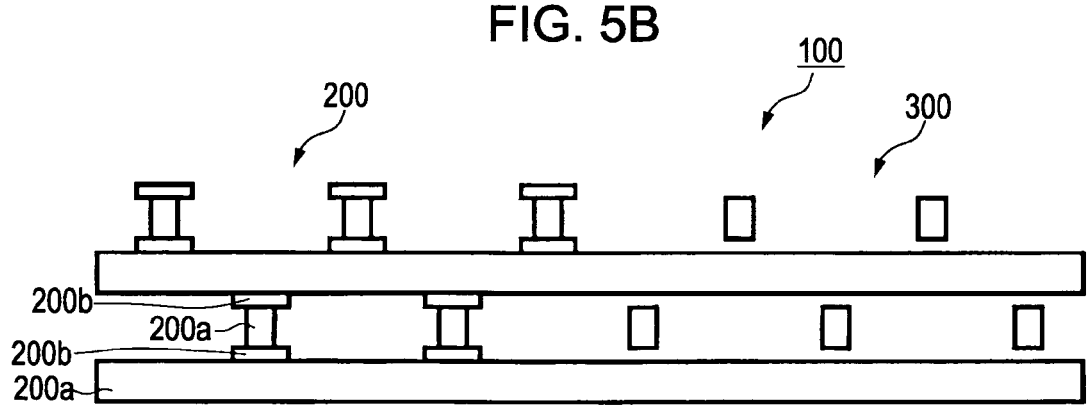

FIG. 5A illustrates the upper face of a photonic crystal that is a modification of the photonic crystal 100 of this exemplary embodiment and FIG. 5B shows a side face of this photonic crystal. This photonic crystal includes rod-shaped structures 200a and discrete structures 200b. Each discrete structure 200b is disposed between two of these rod-shaped structures 200a. Although this photonic crystal has photonic band gaps narrower than those of that photonic crystal 100 in FIG. 1A, this photonic crystal can be readily manufactured.

Figure 6:
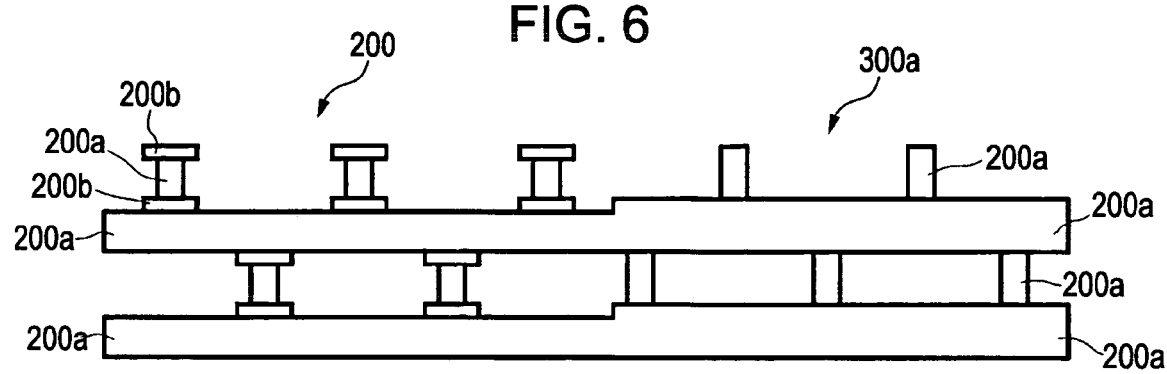
FIG. 6 is an illustration of a photonic crystal that is a modification of the photonic crystal of the first exemplary embodiment.

With reference to 5B, these rod-shaped structures 200a located in a first region 300 are separated from each other. FIG. 6 shows a photonic crystal that is a modification of the photonic crystal 100 of this exemplary embodiment. This photonic crystal includes a first region 300a and a second region 200. Rod-shaped structures 200a extend in the first and second regions 300a and 200 and discrete structures 200b can be arranged in the second region 200. Portions of the rod-shaped structures 200a in the first region 300a have a height equal to the sum of the height of the discrete structures 200b and the height of portions of the rod-shaped structures 200a in the second region 200. Thus this photonic crystal will have higher mechanical strength; the height of 200a in region 300a facilitates matching the vertical spacing between the rod-shaped structures 200a in the second region 200.

Figure 4C:
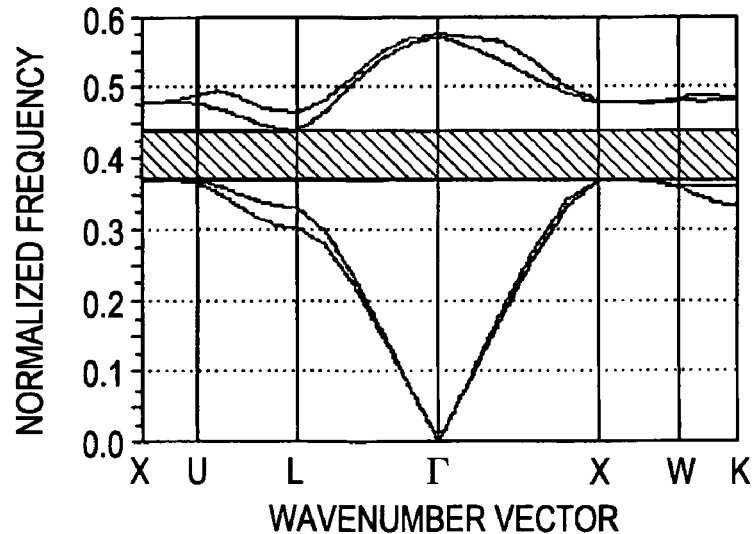
FIG. 4C is a graph showing a photonic band structure of another photonic crystal.

FIG. 4C shows a photonic band structure of a photonic crystal including rod-shaped structures 200a, arranged at P, having a width of about 0.24 P and a height of about 0.354 P. The rod-shaped structures 200a contain a first medium with a refractive index of about 3.309 and portions of this photonic crystal other than the rod-shaped structures 200a can be filled with a second medium with a refractive index of about 1.0. This photonic crystal exhibits a complete photonic band gap at a normalized frequency of 0.369 to 0.439. When P is 600 nm, this photonic crystal exhibits a complete photonic band gap at a wavelength of 1,367 to 1,626 nm.

Figure 7A:
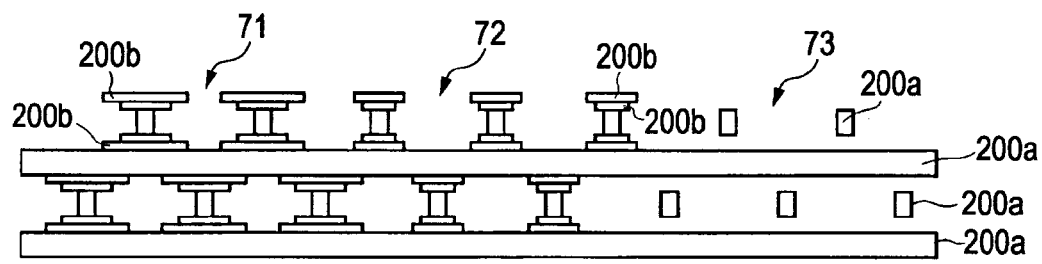
FIGS. 7A and 7B are illustrations of photonic crystals that are modifications of the photonic crystal of the first exemplary embodiment.
Figure 7B:
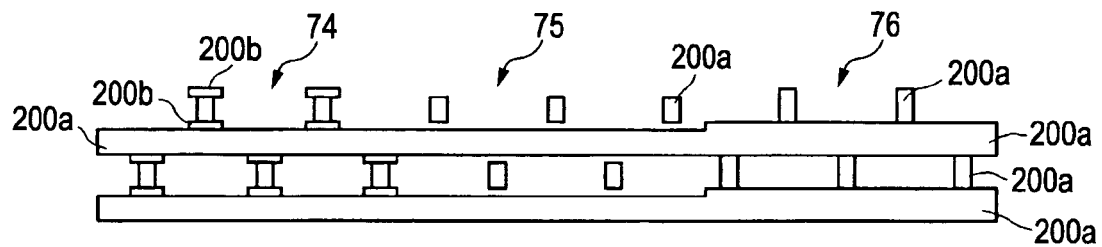

FIG. 7A shows a photonic crystal that is a modification of the photonic crystal 100 of this exemplary embodiment. This photonic crystal includes a first region 71, a second region 72, and a third region 73. The first and second regions 71 and 72 include discrete structures 200b having different sizes. A photonic band gap of this photonic crystal can be precisely controlled. FIG. 7B shows a photonic crystal that is a modification of the photonic crystal 100 of this exemplary embodiment. This photonic crystal includes a first region 74, a second region 75, and a third region 76. The third region 76 includes rod-shaped structures 200a having portions with different heights. Operating wavelengths of this photonic crystal can be precisely controlled.

The variation of the width of rod-shaped structures and/or discrete structures leads to the variation of the filling factor (volume) (refractive index) of a dielectric medium in unit volume. An increase in filling factor increases the effective refractive index of a three-dimensional photonic crystal and thus shifts the center wavelength of a photonic band gap of the photonic crystal to longer wavelengths. Therefore, the photonic band gap center wavelength can be set to a desired value by designing the width of the discrete structures to be an appropriate value.

The photonic crystal 100 of this exemplary embodiment has a layer-by-layer structure including stacked layers having two-dimensional periodic patterns and therefore can be manufactured by a combination of a method for preparing a photonic crystal discussed in U.S. Pat. No. 5,406,573 and another method.

Figure 8A:
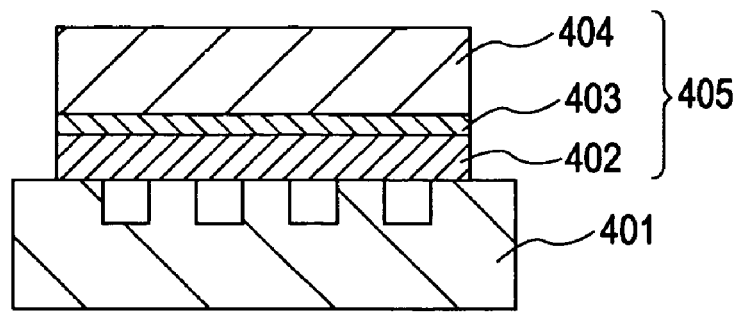
FIGS. 8A to 8C are illustrations showing steps included in a method for preparing a photonic crystal as discussed in U.S. Pat. No. 5,406,573.
Figure 8B:
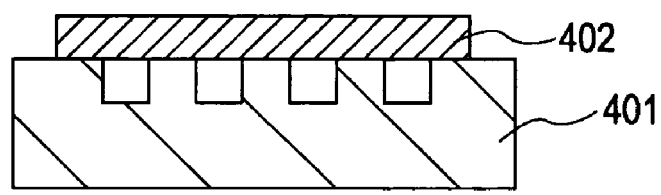
Figure 8C:
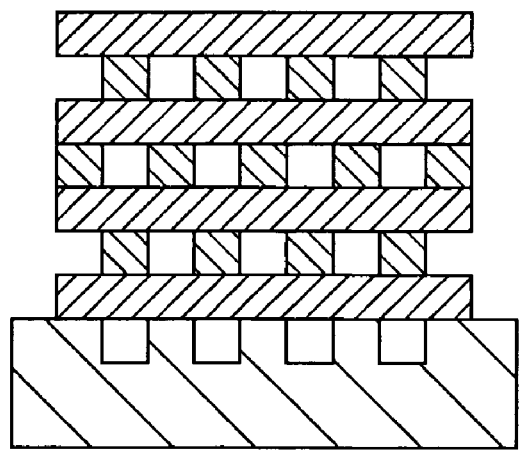
Figure 9A:
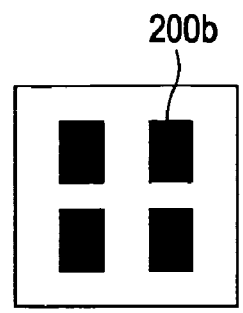
FIGS. 9A to 9D are sectional views of discrete structures included in photonic crystals that are modifications of the photonic crystal of the first exemplary embodiment.
Figure 9B:
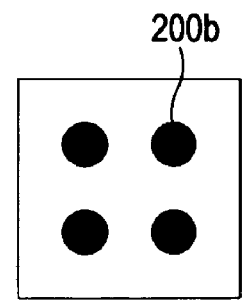
Figure 9C:
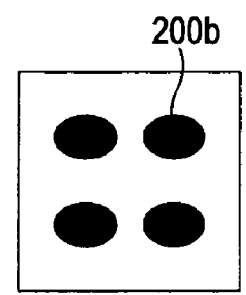
Figure 9D:
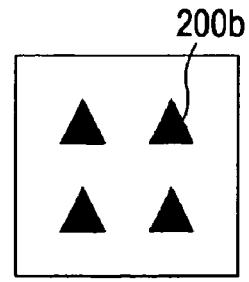

The method discussed in U.S. Pat. No. 5,406,573 will now be described with reference to FIGS. 8A to 8C. As illustrated in FIG. 8A, a transfer substrate 405 is fused to a first substrate 401, which can have a two-dimensional periodic pattern formed by etching. The transfer substrate 405 includes a second substrate 404, an etching stop layer 403, and a transfer layer 402. As illustrated in FIG. 8B, the second substrate 404 and the etching stop layer 403 are removed by etching and a two-dimensional periodic pattern is formed in the transfer layer 402 by etching. The fusing step, the substrate-removing step, and the pattern-forming step are repeated, whereby this photonic crystal having a multilayer structure shown in FIG. 8C is prepared.

The photonic crystal 100 of this exemplary embodiment can be manufactured as described below. The layers including the rod-shaped structures 200a can be formed in one step. When the layers including the discrete structures 200b are formed, discrete structure patterns are formed in the second region 200 and rod-shaped structure patterns are formed in the first region 300 in one step or the first region 300 is not processed. The rod-shaped structure patterns include structures, which can have the same width as that of the rod-shaped structures 200a. The photonic crystal 100 has a plurality of regions, that is, the first and second regions 300 and 200, and a three-dimensional monolithic structure and operates at a plurality of wavelengths and can be manufactured by a variety of methods as known by one of ordinary skill and equivalents. The first and second regions 300 and 200 that operate in different wavelength ranges can be formed in one step; hence, the first and second regions 300 and 200 can be readily aligned with each other and this photonic crystal 100 can be manufactured with high efficiency.

In this exemplary embodiment, the rod-shaped structures 200a are rectangular in cross section; however, the rod-shaped structures 200a can be circular, elliptical, or polygonal in cross section. The discrete structures 200b are rectangular in cross section; however, the discrete structures 200b can be rectangular, circular, elliptical, triangular, or polygonal in cross section as illustrated in FIGS. 9A to 9D.

The rod-shaped structures 200a extend in the X-axis or Y-axis direction in FIG. 2A or 3, that is, the rod-shaped structures 200a extend in the same direction or form an angle of about 90 degrees; however, the rod-shaped structures 200a can form an angle other than 90 degrees. The interval between the rod-shaped structures 200a arranged in parallel to the X axis can be different from that between the rod-shaped structures 200a arranged in parallel to the Y axis. These configurations are effective in imparting desired optical properties to photonic crystals on which light is incident at a predetermined angle or effective in imparting anisotropy to photonic crystals. The rod-shaped structures 200a and the discrete structures 200b contain the first medium; however, the rod-shaped structures 200a and the discrete structures 200b can contain a different medium.

The photonic crystal 100 of this exemplary embodiment can contain two or more types of media having different refractive indices. For example, the first medium can be a material, such as Si, GaAs, InP, Ge, $TiO_2$, GaN, $Ta_2O_5$, or $Nb_2O_5$, which can have a high refractive index. Furthermore, the first medium can absorb no light applied to the photonic crystal 100 of this exemplary embodiment and be transparent. The second medium can have a low refractive index. Examples of the second medium include dielectric materials such as $SiO_2$, organic polymers such as PMMA, air, and water. Since a periodic variation of the refractive index of a photonic crystal results in a photonic band gap, a wide photonic band gap can be achieved by the combination of media having different refractive indices between which a difference is large. In order to achieve a sufficiently wide photonic band gap, a difference in refractive index between the first and second media can be two or more.

The two-dimensional periodic patterns can be formed by an etching process in combination with an interference exposure process; a nanoimprinting process; a multiphoton absorption process using a ultra-short pulsed beam; a lithographic process using an X-ray exposure technique, an ultraviolet ray exposure technique, or a nearfield exposure technique; or another process as known by one of ordinary skill in the relevant arts and equivalents. Alternatively, the two-dimensional periodic patterns can be formed by selective growth using a mask pattern.

Second Exemplary Embodiment

Figure 10A:
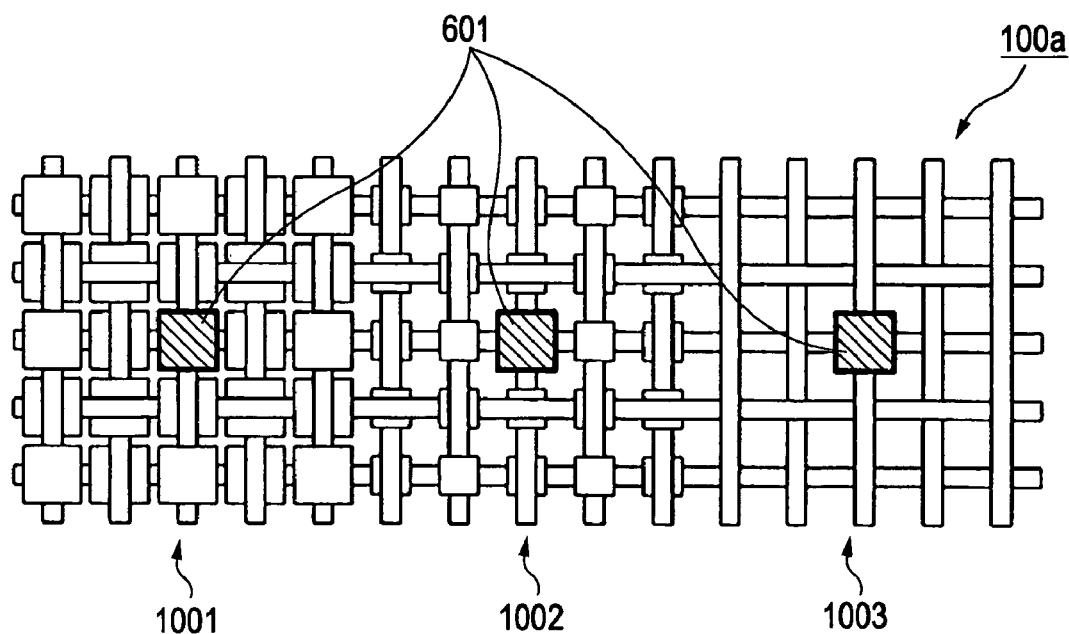
FIG. 10A is a top view of a three-dimensional photonic crystal according to a second exemplary embodiment of the present invention and FIG. 10B is a side view thereof.
Figure 10B:
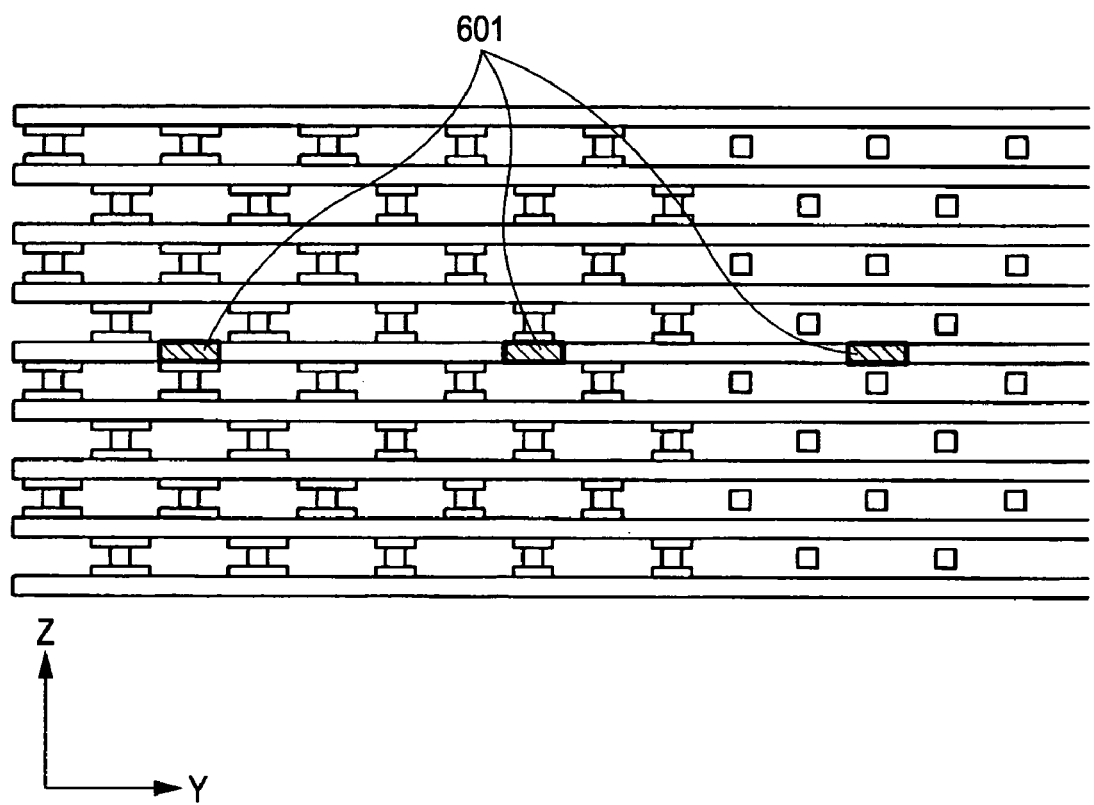

FIG. 10A illustrates the upper face of a three-dimensional photonic crystal 100 according to a second exemplary embodiment of the present invention and FIG. 10B shows a side face of the three-dimensional photonic crystal 100a. The three-dimensional photonic crystal 100a includes a first region 1001, a second region 1002, and a third region 1003 and has point defects 601. The first to third regions 1001 to 1003 include rod-shaped structures 200a and the first and second regions 1001 and 1002 include discrete structures 200b having different shapes. The center wavelength of a photonic band gap of the three-dimensional photonic crystal 100a is controlled in such a manner that the shapes of the discrete structures 200b are varied although the grating period in the X-Z plane and that in the X-Y plane are maintained constant. The three-dimensional photonic crystal 100a has a resonant mode due to the point defects 601. Light with a wavelength corresponding to the resonant mode is localized in the point defects 601. The point defects 601 can be created by removing portions of the rod-shaped and/or discrete structures 200a and/or 200b to form cavities, by varying the shapes of some of the rod-shaped and/or discrete structures 200a and/or 200b, or by providing portions, which can have a refractive index different from that of the rod-shaped and/or discrete structures 200a and/or 200b in the rod-shaped and/or discrete structures 200a and/or 200b.

Figure 11:
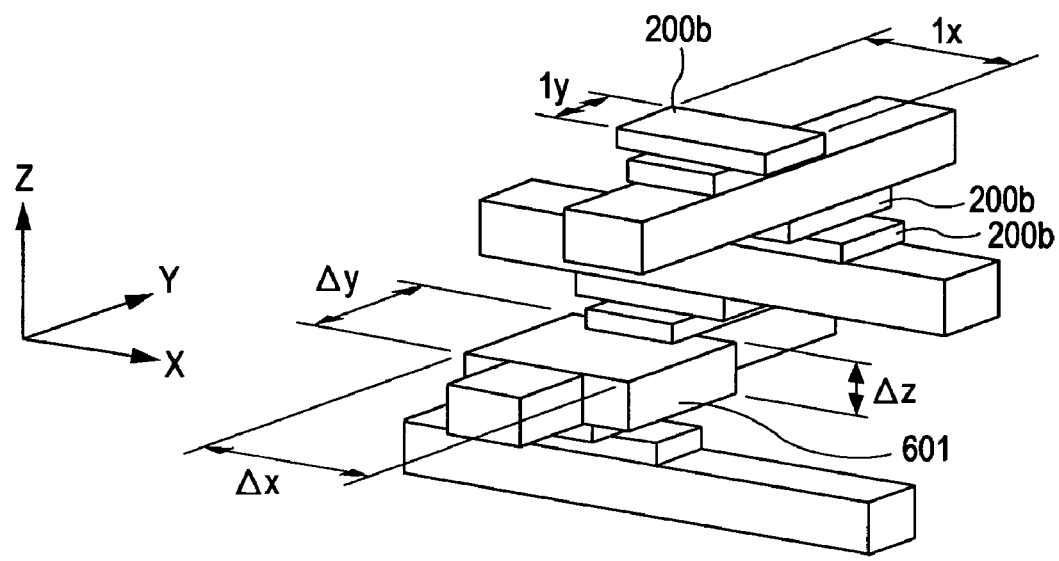
FIG. 11 is an illustration showing layers included in the three-dimensional photonic crystal of the second exemplary embodiment.

FIG. 11 shows two layers, included in the three-dimensional photonic crystal 100a, including the discrete structures 200b. The rod-shaped structures 200a and the discrete structures 200b contain a first medium with a refractive index of about 3.309 and portions of the three-dimensional photonic crystal 100a other than the rod-shaped structures 200a and the discrete structures 200b contain a second medium with a refractive index of about 1.0. The rod-shaped structures 200a have a width of about 0.25 P and a height of about 0.3 P, wherein P represents the interval between the rod-shaped structures 200a arranged in each layer. The discrete structures 200b have a height of about 0.05 P and have rectangular faces, parallel to the X-Y plane, each having a size of about 0.4 P×0.6 P. As illustrated in FIG. 11, the point defects 601 have a rectangular parallelepiped shape and can satisfy the following equations: $\Delta x \approx 0.70$ P, $\Delta y \approx 0.70$ P, and $\Delta z \approx 0.30$ P. The point defects 601 can have square faces which are parallel to the X-Y plane and in which $\Delta x$ is equal to $\Delta y$. Alternatively, the point defects 601 can have faces which are parallel to the X-Y plane and in which $\Delta x$ is unequal to $\Delta y$. The point defects 601 can have faces which are parallel to the X-Y plane and which are circular, elliptical, triangular, or polygonal.

Figure 12:
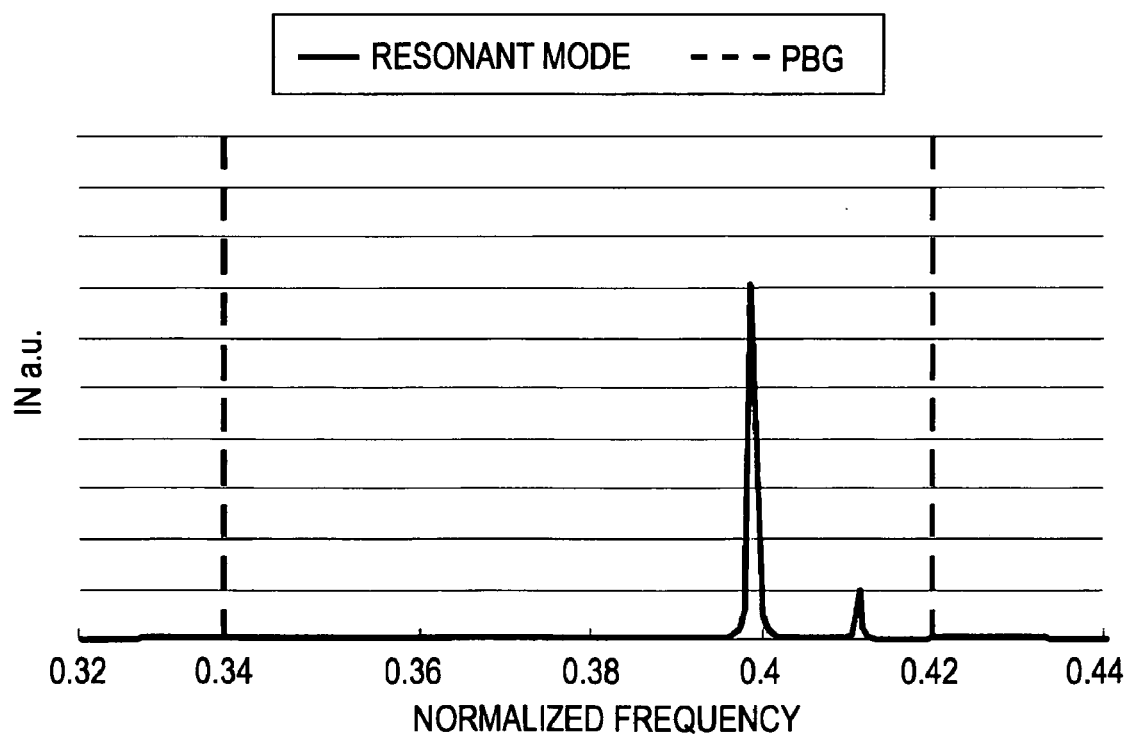
FIG. 12 is a graph showing a resonant mode of the three-dimensional photonic crystal of the second exemplary embodiment.

The resonant mode of the three-dimensional photonic crystal 100a will now be described with reference to FIG. 12. In FIG. 12, the horizontal axis represents the intensity and the vertical axis represents the normalized frequency determined using grating period a. A large peak is centered near a normalized frequency of 0.40. This suggests the presence of the resonant mode. A resonant wavelength of the three-dimensional photonic crystal 100 can be controlled in such a manner that a photonic band gap of the three-dimensional photonic crystal 100 is shifted by varying the filling factor of a material contained in the three-dimensional photonic crystal 100a. The material filling factor can be controlled by varying the size of the discrete structures 200b. Since the point defects 601 can be arranged in the first to third regions 1001 to 1003, the three-dimensional photonic crystal 100a is useful in manufacturing a monolithic optical resonator operating at a plurality of wavelengths or a monolithic optical filter operating in a narrow band. The point defects 601 can be present in each of the first to third regions 1001 to 1003.

FIG. 13 shows a three-dimensional photonic crystal 100b that is a modification of the three-dimensional photonic crystal 100a of this exemplary embodiment. This three-dimensional photonic crystal includes a first region 1301, a second region 1302, and a third region 1303 and has point defects 601. These first and second regions 1301 and 1302 include discrete structures 200b having different refractive indices. Since these first to third regions 1301 to 1303 are different in refractive index from each other, this three-dimensional photonic crystal is useful in manufacturing a resonator operating at different resonant wavelengths. For example, this photonic crystal 100b is applicable to an optical filter for obtaining narrow band spectra in a plurality of wavelength ranges.

Figure 14A:
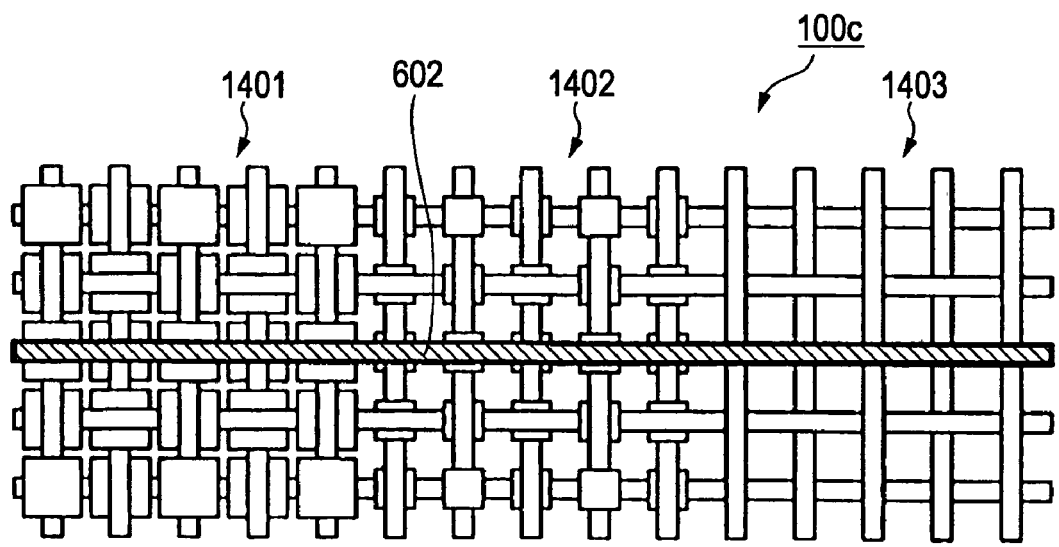
FIG. 14A is a top view of a three-dimensional photonic crystal that is a modification of the three-dimensional photonic crystal of the second exemplary embodiment and FIG. 14B is side view thereof.
Figure 14B:
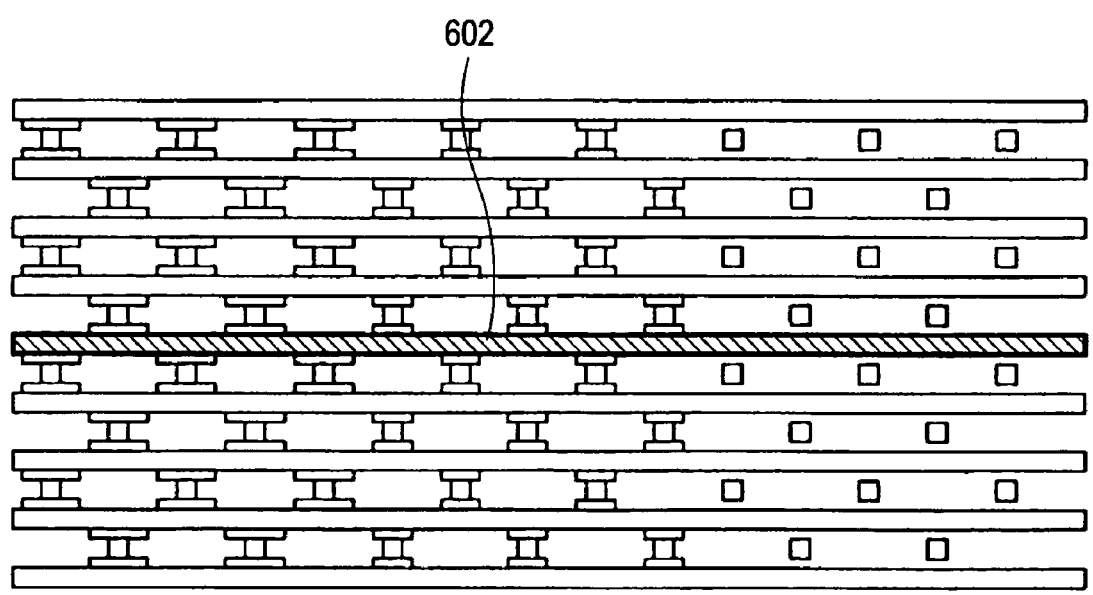

FIG. 14A illustrates the upper face of a three-dimensional photonic crystal 100c that is a modification of the three-dimensional photonic crystal 100a of this exemplary embodiment and FIG. 14B shows a side face of this third photonic crystal 100c. This three-dimensional photonic crystal-includes a first region 1401, a second region 1402, and a third region 1403 and has a linear defect 602. These first to third regions 1301 to 1303 include rod-shaped structures 200a and the first and second regions 1401 and 1402 include discrete structures 200b having different shapes. Since this three-dimensional photonic crystal has the linear defect 602, this three-dimensional photonic crystal has a waveguide mode due to the linear defect 602; hence, light with a wavelength corresponding to the waveguide mode propagates in the linear defect 602. The center wavelength of a photonic band gap of this three-dimensional photonic crystal can be controlled in such a manner that the shapes of these discrete structures 200b are varied although the grating period in the X-Z plane and that in the X-Y plane are maintained constant. The linear defect 602 can be formed by removing one of these rod-shaped structures 200a, varying the width of one of these rod-shaped structures 200a, varying the refractive index of one of these rod-shaped structures 200a, or adding another rod-shaped structure 200a to this three-dimensional photonic crystal. A monolithic optical waveguide and a monolithic delay circuit with wavelength selectivity can be obtained by arranging a plurality of three-dimensional photonic crystals related to this three-dimensional photonic crystal 100c without varying the grating periods of the optical waveguide and the optical delay circuit.

Figure 15A:
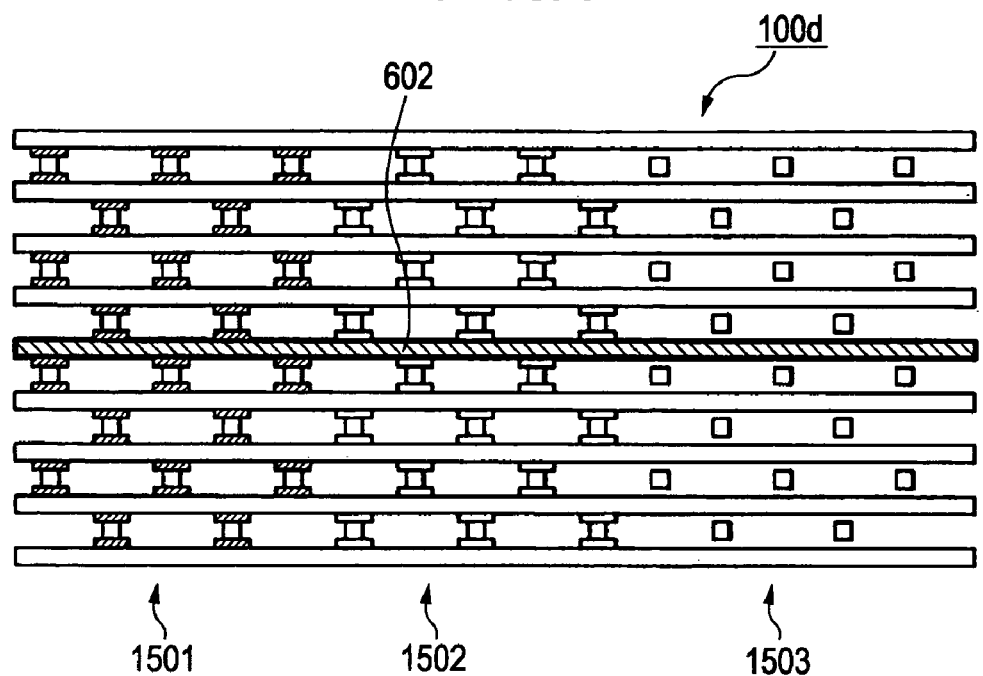
FIGS. 15A and 15B are illustrations of a three-dimensional photonic crystal that is a modification of the three-dimensional photonic crystal of the second exemplary embodiment.
Figure 15B:
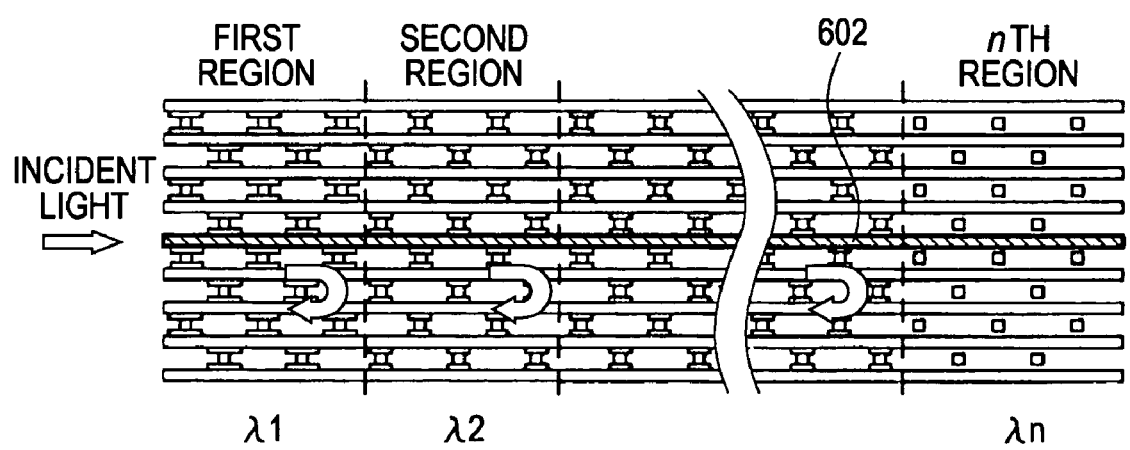

FIGS. 15A and 15B show portions of a three-dimensional photonic crystal 100d that is a modification of the three-dimensional photonic crystal of this exemplary embodiment. This three-dimensional photonic crystal 100*d* includes a first region 1501, a second region 1502, and a third region 1503 and has a linear defect 602. These first and second regions 1501 and 1502 include discrete structures 200*b* having different refractive indices. A waveguide with wavelength selectivity by interface reflection can be achieved in such a manner that the relationships between photonic band gaps and waveguide modes of these first and second regions 1501 and 1502 can be controlled by adjusting the refractive indices of the discrete structures 200*b*. These first and second regions 1501 and 1502 have different photonic band gaps due to these discrete structures 200*b* having different refractive indices. Therefore, a light λ1 with a certain wavelength is allowed to propagate in this first region 1501 but forbidden to propagate in the second region 1502, that is, the light λ1 is substantially totally reflected at the interface between these first and second regions 1501 and 1502. This three-dimensional photonic crystal is applicable to a dispersion compensation device for compensating time delay at a plurality of wavelengths.

A combination of point defects 601 and a linear defect 602 can be used for an optical add/drop multiplexer (optical add/drop circuit) with high wavelength selectivity and efficiency.

Figure 16:
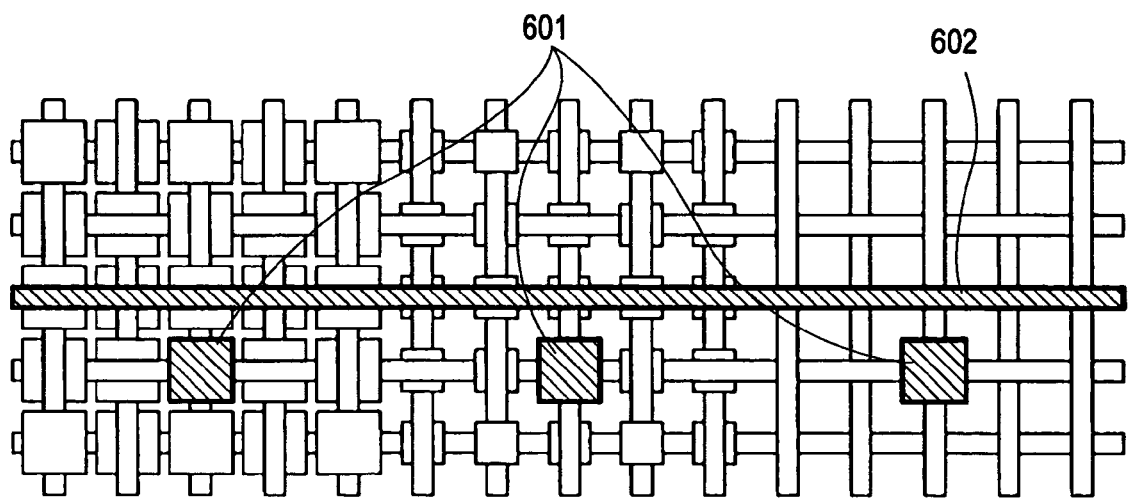
FIG. 16 is a top view of a three-dimensional photonic crystal that is a modification of the three-dimensional photonic crystal of the second exemplary embodiment.
Figure 17:
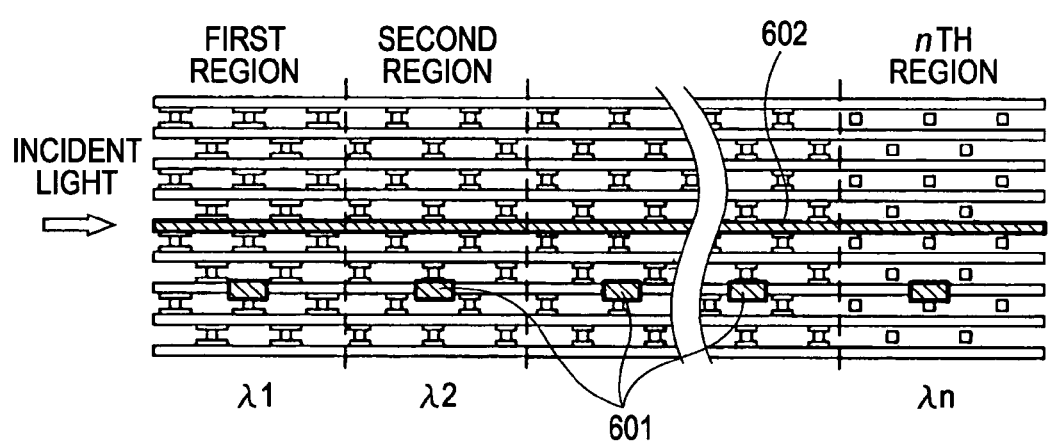
FIG. 17 is a side view of the three-dimensional photonic crystal illustrated in FIG. 16.

FIG. 16 illustrates the upper face of a three-dimensional photonic crystal that is a modification of the three-dimensional photonic crystal of this exemplary embodiment and FIG. 17 shows a side face thereof. This three-dimensional photonic crystal includes regions including discrete structures having different refractive indices and has point defects 601 and a linear defect 602. Since this linear defect 602 serves as an optical waveguide and these point defects 601 serve as resonators, this three-dimensional photonic crystal is useful in manufacturing an optical multiplexing device (optical input/output circuit) for optical communication.

Figure 18:
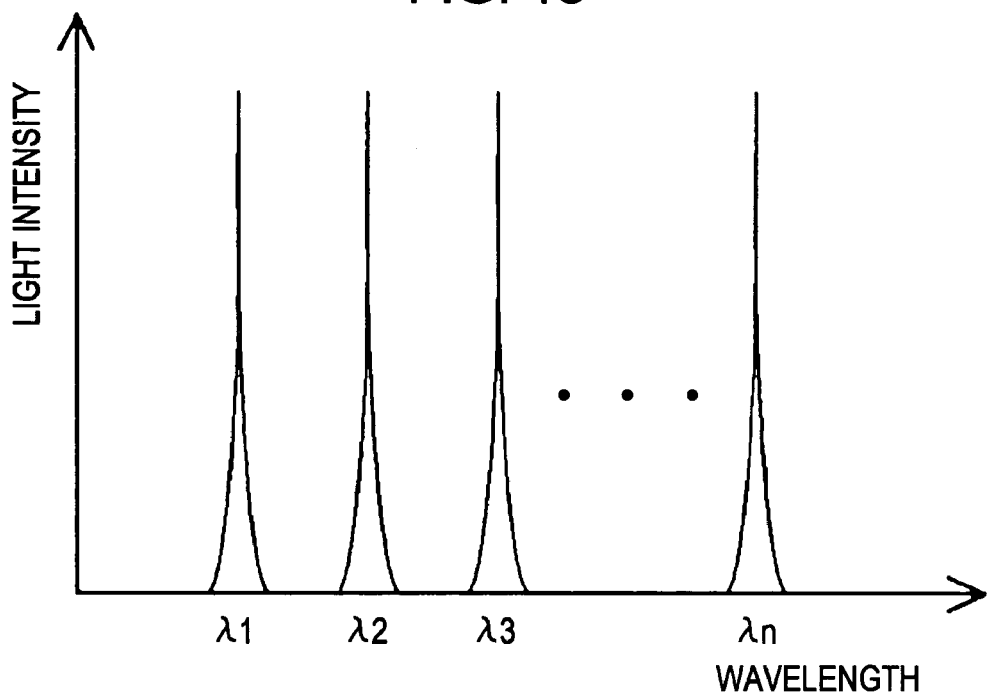
FIG. 18 is a graph showing a spectrum of a light flux applied to a three-dimensional photonic crystal that is a modification of the three-dimensional photonic crystal of the second exemplary embodiment.

FIG. 18 shows a spectrum of a light flux with resonant wavelengths λ1, λ2, λ3, . . . , and λn that are the same as those of these resonators. If the light flux is introduced into this waveguide, light components with such resonant wavelengths can be extracted from these resonators. In contrast, if light fluxes are applied to these resonators, the light fluxes can be multiplexed in the waveguide.

*Nature*, vol. 407, p. 608 (2000) reports the optical add/drop multiplexer, which has a two-dimensional in-plane hetero structure; however, this structure cannot be simply applied to three-dimensional photonic crystals as described above. In this three-dimensional photonic crystal, light can be securely confined in these resonators; hence, polarization and/or radiation dispersion can be precisely controlled by the control of resonant mode dispersion. Since these regions serving as resonators are three-dimensionally arranged, this three-dimensional photonic crystal has a high degree of freedom in extracting light in a desired direction. Therefore, this three-dimensional photonic crystal is useful in manufacturing an optical multiplexing device which operates in a narrow band and which has a high degree of freedom in extracting light in a desired direction.

Figure 19:
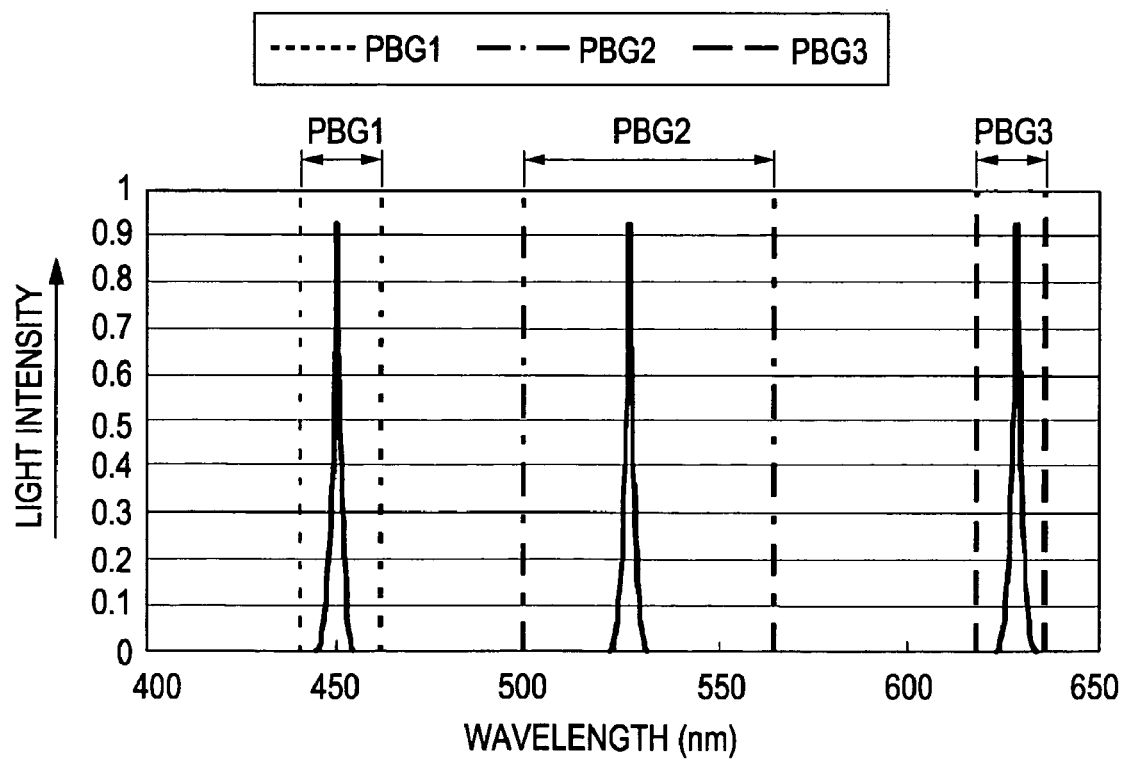
FIG. 19 is a graph showing photonic band gaps of this three-dimensional photonic crystal.

The center wavelengths of photonic band gaps can be controlled by varying the sizes (shapes) and refractive indices of discrete structures. If a three-dimensional photonic crystal includes, for example, three different regions including different discrete structures and has point defects, this three-dimensional photonic crystal is useful in manufacturing a resonator operating at different wavelengths. FIG. 19 shows photonic band gaps of this three-dimensional photonic crystal, which is a modification of the three-dimensional photonic crystal of this exemplary embodiment. As illustrated in FIG. 19, this three-dimensional photonic crystal has sharp peaks centered at 450, 530, or 630 nm. The peaks are present in the photonic band-gaps due to the point defects and correspond to resonant wavelengths of these regions.

Third Exemplary Embodiment

A light-emitting device of this exemplary embodiment includes a three-dimensional photonic crystal which includes a plurality of regions including discrete structures 200*b* having different shapes or refractive indices and which has point defects 601 filled with a luminescent material. Since the point defects 601 serves as resonators and are present in the three-dimensional photonic crystal, the three-dimensional photonic crystal has resonant modes due to the point defects 601 and lights having wavelengths corresponding to the resonant modes are localized in the resonators. If the luminescent material emits lights having resonant wavelengths corresponding to the resonant modes, a strong light beam with a narrow wavelength can be emitted from light-emitting device with high efficiency. The light-emitting device is useful in three-dimensionally controlling the behavior of light. Examples of the luminescent material include compound semiconductors, inorganic luminescent materials, organic luminescent materials, polymeric luminescent materials, quantum dots, and nanocrystals. Examples of a method for exciting the luminescent material include photoexcitation due to an external light source and excitation due to current injection. If the luminescent material is excited by the current injection excitation, light can be emitted from the luminescent material in such a manner that the luminescent material is sandwiched between electrodes made of a metal (e.g., Al, Cr, or a transparent conductive material such as ITO). If the resonators are connected to electrodes operating independently, the resonators can be independently controlled such that light beams with different wavelengths are emitted.

Figure 20:
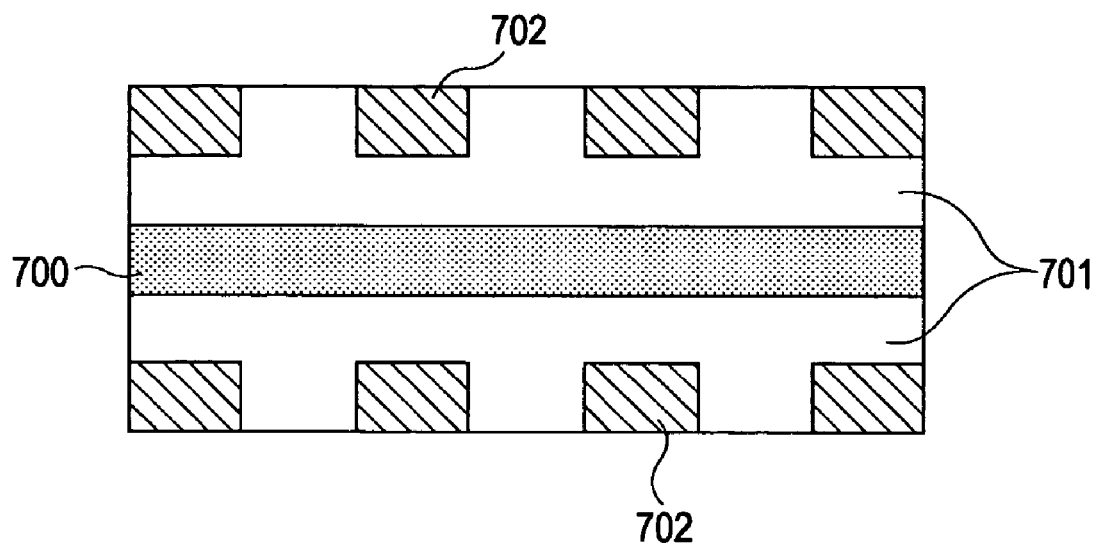
FIG. 20 is an illustration of one of light-emitting sections included in a light-emitting device according to a third exemplary embodiment of the present invention.

FIG. 20 shows one of light-emitting sections included in the light-emitting device. The light-emitting section includes insulating layers 701; a light-emitting layer 700, disposed therebetween, containing a luminescent material (e.g., an inorganic luminescent material); and electrodes 702 arranged on both sides of the light-emitting layer 700. The light-emitting sections are disposed in the point defects 601, which serve as resonators. Therefore, light with a wavelength determined due to the point defects 601 can be extracted by resonance. These electrodes 702 can be made of a transparent material and can be made of a metal such as Al, Au, or Cr. Examples of the inorganic luminescent material include ZnS—Mn, ZnMgS—Mn, ZnS—Sm, ZnS—Tb, ZnS—Tm, CaS—Eu, SrS—Ce, SrS—Cu, SrGa$_2$S$_4$—Ce, and BaAl$_2$S$_4$—Eu. The insulating layers 701 can be made of SiO$_2$, SiN, Al$_2$O$_3$, Ta$_2$O$_5$, or SrTiO$_3$.

Figure 21:
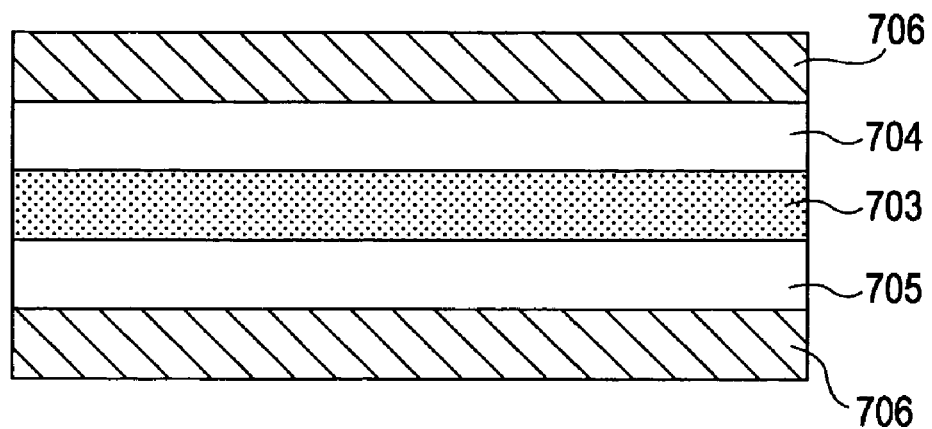
FIG. 21 is an illustration of one of light-emitting sections included in a light-emitting device that is a modification of the light-emitting device of the third exemplary embodiment.

An organic luminescent material can be used instead of the inorganic luminescent material. FIG. 21 shows one of light-emitting sections included in a light-emitting device that is a modification of the light-emitting device of this exemplary embodiment. This light-emitting section includes an electron transport layer 704; a hole transport layer 705; a light-emitting layer 703, disposed therebetween, containing the organic luminescent material; and electrodes 706 each disposed on the electron transport layer 704 or the hole transport layer 705. This light-emitting section can emit light with a wavelength corresponding to the organic luminescent material. This light-emitting section can further include an electron injection layer, a hole injection layer, and/or another layer. One or both of the electrodes (e.g., 706) can be made of a transparent material such as ITO and the other one can be made of a metal, such as Al or Cr, instead of ITO.

Examples of the organic luminescent material include low-molecular-weight organic luminescent materials such as Alq, Eu(DBM)$_3$(Phen), BeBq, and DPVBi and high-molecular-weight organic luminescent materials such as conductive polymers including polythiophene and polyaniline doped with polystyrene sulfonic acid or camphor sulfonic acid. Examples of a material for forming the hole transport layer 705 include low-molecular-weight materials such as TPD, α-NPD, TPT, and Spiro-TPD. Examples of a material for forming the electron transport layer 704 include low-molecular-weight materials such as PBD, TAZ, OXD, and Bphen. Various materials other than these materials can be used.

If a resonator has point defects and includes current injection-type light-emitting structures which are disposed in the point defects and which contain a luminescent material such as a compound semiconductor, an inorganic luminescent material, an organic luminescent material, a polymeric luminescent material, a quantum dot, or a nanocrystal, light with a desired wavelength can be extracted from the resonator by resonance.

Figure 22:
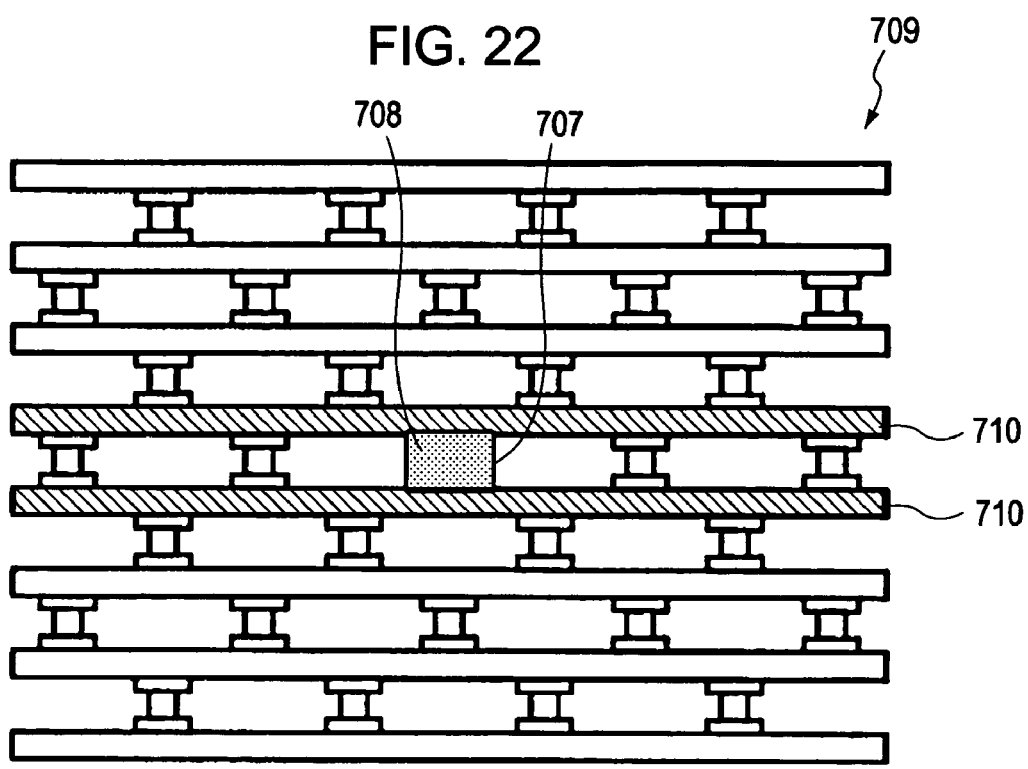
FIG. 22 is an illustration of a photonic crystal included in a light-emitting device that is a modification of the light-emitting device of the third exemplary embodiment.

FIG. 22 shows a photonic crystal 709 included in a light-emitting device that is a modification of the light-emitting device of this exemplary embodiment. This light-emitting device includes transparent electrodes 710, made of ITO, for current injection and a point defect resonator 707, disposed in the photonic crystal 709, containing a luminescent material 708. The transparent electrodes 710 can extend through the photonic crystal 709. This light-emitting device is simple in configuration because the transparent electrodes 710 can be used as waveguides for extracting light from the point defect resonator 707. That is, the transparent electrodes 710 can serve as linear defects in the photonic crystal 709, which has a periodic structure. Therefore, portions of a light beam can be extracted from the photonic crystal 709 through the transparent electrodes 710 in such a manner that the light beam is emitted from the luminescent material 708 by applying a current to the luminescent material 708 and then resonated in the point defect resonator 707.

Figure 23:
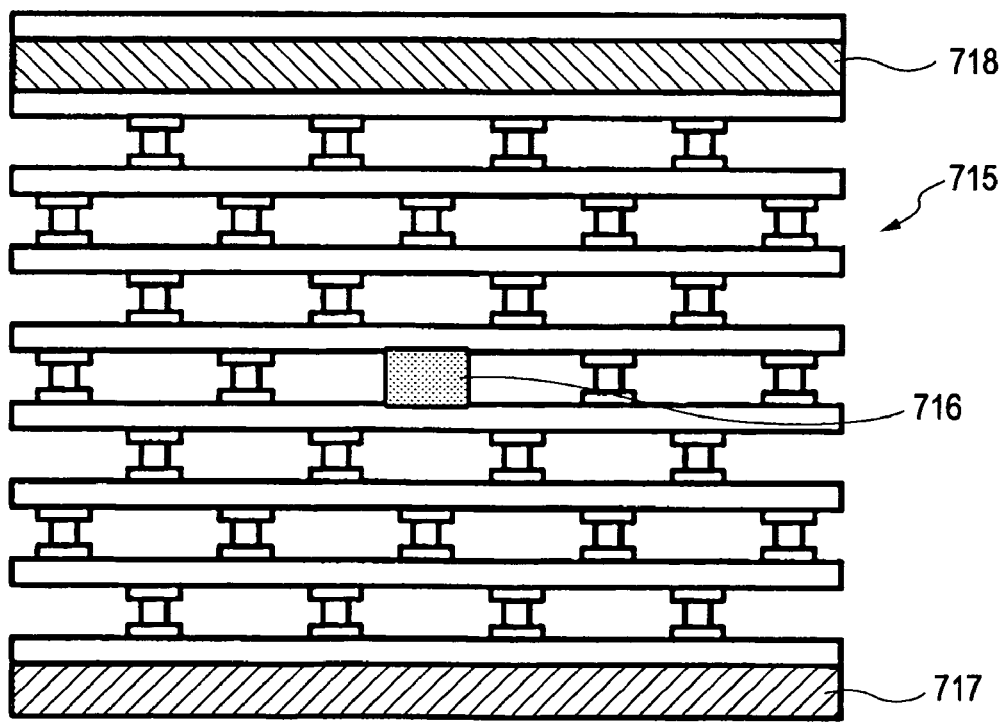
FIG. 23 is a schematic view of a light-emitting device that is a modification of the light-emitting device of the third exemplary embodiment.

In the case where photoexcitation is performed using an external light source, a luminescent material can be excited with high efficiency using excitation light having wavelengths outside a photonic band gap so as to emit light. FIG. 23 shows a light-emitting device that is a modification of the light-emitting device of this exemplary embodiment. This light-emitting device includes a photonic crystal 715, which can have a point defect resonator 716 containing a fluorescent material emitting light with a wavelength within a photonic band gap of the photonic crystal 715; an ultraviolet light-emitting layer 717, disposed under the photonic crystal 715, serving as an ultraviolet light source for emitting ultraviolet light, which can have a wavelength shorter than the photonic band gap thereof, for exciting the fluorescent material; and a wavelength-selective filter 718 disposed on the photonic crystal 715. Light emitted from the point defect resonator 716 passes through the wavelength-selective filter 718 and ultraviolet light emitted from the ultraviolet light-emitting layer 717 is blocked by the wavelength-selective filter 718. This leads to an improvement in the visibility of an observer. Light emitted from the point defect resonator 716 can be controlled by varying the voltage applied to the ultraviolet light-emitting layer 717.

If this light-emitting device further includes a light source containing a luminescent medium with an emission spectrum including resonant wavelengths, this light-emitting device can be used as a monolithic laser for emitting light beams with such resonant wavelengths. If the resonant wavelengths correspond to wavelengths in an optical communication band, this light-emitting device is useful in manufacturing a monolithic light source for multi-wavelength lasers. Such a monolithic light source has a small size and high integration and is therefore that can be used for optical communication. Examples of the optical communication band include the O-band (1,260 to 1,360 nm), the E-band (1,369 to 1,460 nm), the S-band (1,460 to 1,530 nm), the C-band (1,530 to 1,565 nm), the L-band (1,565 to 1,625 nm), and the U-band (1,625 to 1,675 nm). If the resonant wavelengths correspond to red (R), green (G), and blue (B) that are the primary colors of light, this light-emitting device is useful in manufacturing an RGB monolithic laser light source. Such a RGB monolithic laser light source can be used as a full-color light source for display units such as projective display units. The red wavelength band is typically 600 to 780 nm, the green wavelength band is typically 500 to 600 nm, and the blue wavelength band is typically 400 to 500 nm.

If this light-emitting device is used for an optical recording/reproducing light source for compact disks (CDs) or digital versatile disks (DVDs), the resonant wavelengths are preferably adjusted to about 785 nm and 660 nm. This light-emitting device can be used for a high-density optical recording/reproducing light source using a blue light beam with a wavelength of 405 nm. Therefore, a monolithic light source, emitting three light beams having different wavelengths, for optical recording/reproducing can be manufactured. Such a monolithic light source can be used for a small-sized, versatile optical head for optical disk recording/reproducing.

Fourth Exemplary Embodiment

Figure 24:
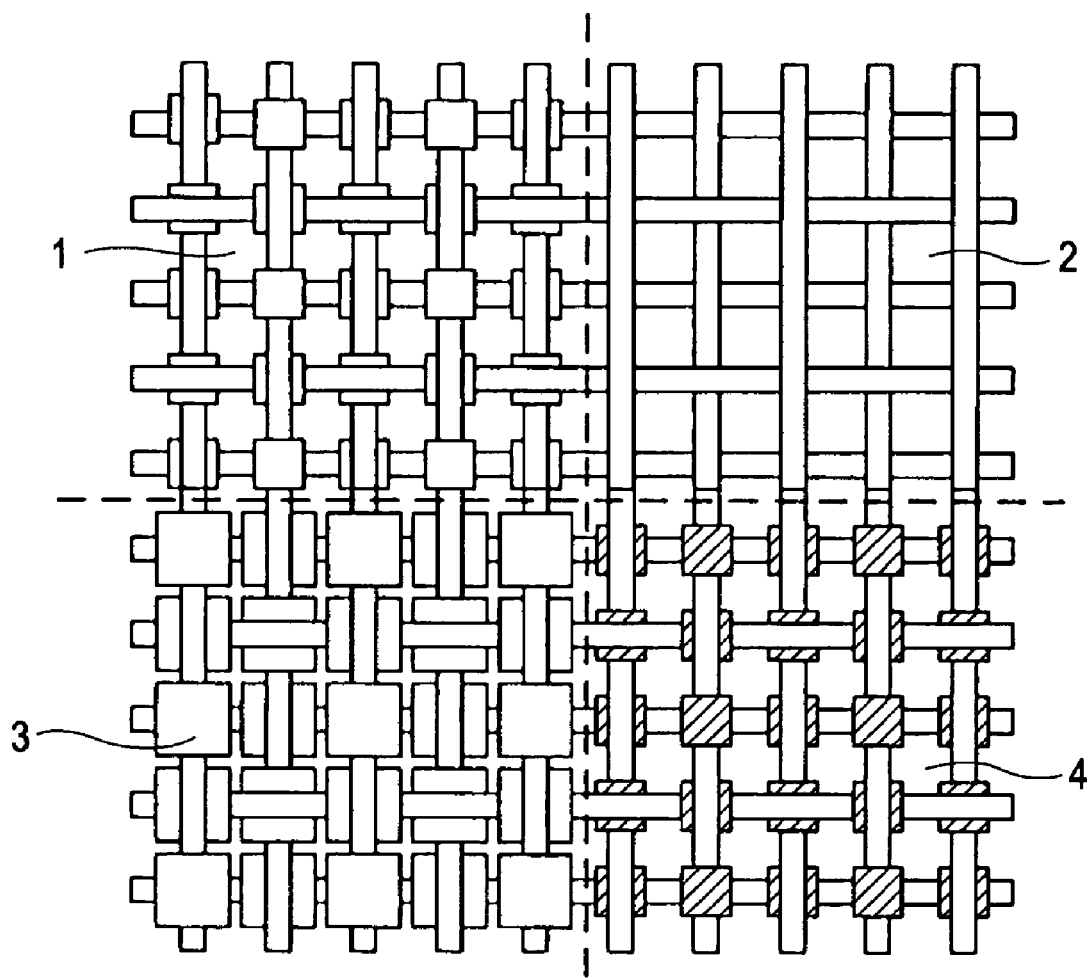
FIG. 24 is a schematic view of a color filter according to a fourth exemplary embodiment of the present invention.
Figure 25A:
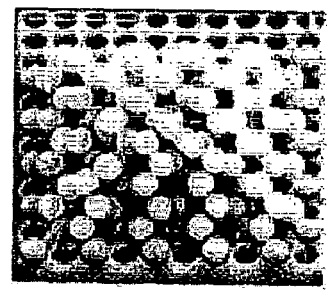
FIGS. 25A to 25E are illustration showing a diamond opal structure, a wood-pile structure, a spiral structure, a unique three-dimensional structure, and a structure inverse to the three-dimensional structure.
Figure 25B:
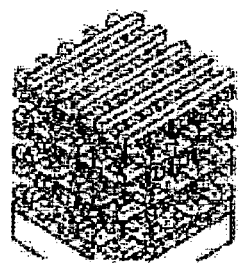
Figure 25C:
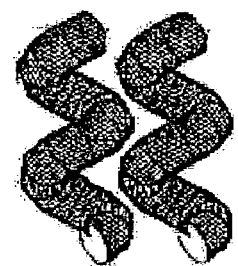
Figure 25D:
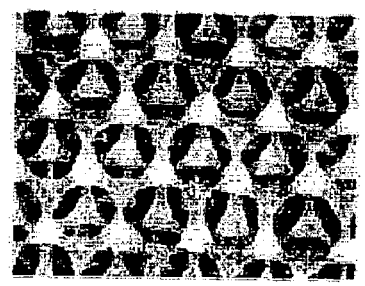
Figure 25E:
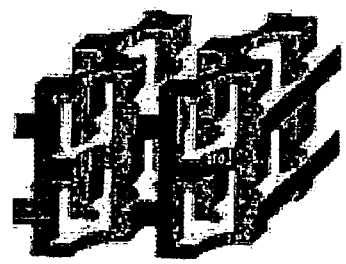
Figure 26:
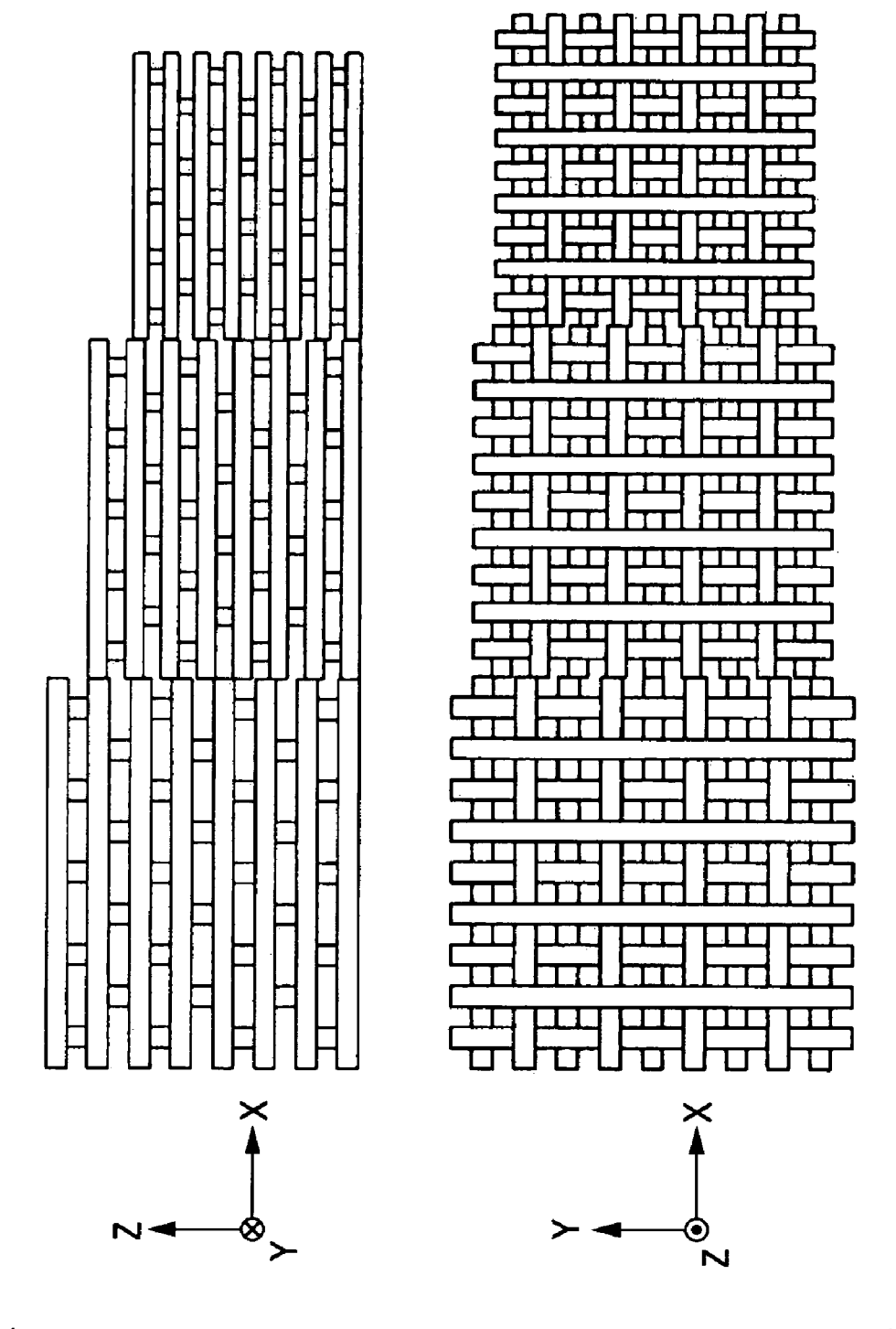
FIG. 26 includes illustration showing grating periods of known photonic crystals.

FIG. 24 shows a color filter, including a three-dimensional photonic crystal, according to a fourth exemplary embodiment of the present invention. The three-dimensional photonic crystal includes a first region 1, a second region 2, a third region 3, and a fourth region 4. The sum of the areas of the first to fourth regions 1 to 4 is equal to the area of each pixel included in a liquid crystal panel. Therefore, the three-dimensional photonic crystal is can be used for a color filter for display units. If the sum of the areas of the first to fourth regions 1 to 4 is equal to the area of each pixel included in an image sensor, the three-dimensional photonic crystal can be used for a color filter for image sensors. The center operating wavelength and/or an operating wavelength band of the three-dimensional photonic crystal can be freely selected by properly designing the three-dimensional periodic structure of the three-dimensional photonic crystal. Furthermore, a high-quality color filter having good incident angle characteristics and high color reproducibility can be manufactured by properly designing a photonic band gap of the three-dimensional photonic crystal. The first to fourth regions 1 to 4 operating at different wavelengths can be formed in one step; hence, that color filter can be readily aligned with the liquid crystal panel or the image sensor.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2005-145630 filed May 18, 2005, which is hereby incorporated by reference herein in its entirety.

What is claimed is:

1. A three-dimensional photonic crystal exhibiting photonic band gaps, comprising:
   a first region including a first layer, a second layer, a third layer and a fourth layer; and
   a second region including the first layer, the second layer, the third layer, the fourth layer and additional layers including discrete structures spaced from each other,
   wherein the first to fourth layers are arranged in that order,
   wherein the first to fourth layers include a plurality of rod-shaped structures arranged at a predetermined interval,
   wherein the rod-shaped structures included in the first and third layers extend in the same direction,
   wherein the rod-shaped structures included in the second and fourth layers extend in the same direction,
   wherein the longitudinal direction of the rod-shaped structures included in the first and third layers is different from that of the rod-shaped structures included in the second and fourth layers,
   wherein the rod-shaped structures included in the first layer are displaced by half of the predetermined interval from those included in the third layer in the direction perpendicular to the direction in which those included in the first and third layers extend,
   wherein the rod-shaped structures included in the second layer are displaced by half of the predetermined interval from those included in the fourth layer in the direction perpendicular to the direction in which those included in the second and fourth layers extend,
   wherein the additional layers in the second region are disposed between the first to fourth layers in parallel to the first to fourth layers,
   wherein the discrete structures are located at positions corresponding to the intersections of the rod-shaped structures included in the first to fourth layers, and
   wherein the horizontal interval and the vertical interval of the rod-shaped structures in the first region are the same as those of the rod-shaped structures in the second region, respectively.

2. The three-dimensional photonic crystal according to claim 1, wherein the second region includes two or more sub-regions in which the discrete structures have different shapes or contain media with different refractive indices.

3. The three-dimensional photonic crystal according to claim 1, wherein the second region includes two or more sub-regions in which the discrete structures have different shapes and contain media with different refractive indices.

4. The three-dimensional photonic crystal according to claim 1, wherein the first and second regions have different photonic band gaps.

5. The three-dimensional photonic crystal according to claim 1, wherein the rod-shaped structures in the first region have the same width as that of the rod-shaped structures in the second region.

6. The three-dimensional photonic crystal according to claim 1, wherein the rod-shaped structures in the first region have the same height as that of the rod-shaped structures in the second region.

7. The three-dimensional photonic crystal according to claim 1, wherein the rod-shaped structures in the first region have a height different from that of the rod-shaped structures in the second region.

8. An optical device comprising the three-dimensional photonic crystal according to claim 1, wherein the three-dimensional photonic crystal has a defect.

9. The optical device according to claim 8, wherein the three-dimensional photonic crystal has a linear defect configured to operate as a waveguide.

10. The optical device according to claim 9, configured to operate as a dispersion compensation device.

11. The optical device according to claim 8, wherein the three-dimensional photonic crystal has a point defect configured to operate as a resonator.

12. The optical device according to claim 11, configured to operate as a narrow-band optical filter operating at a plurality of wavelengths.

13. The optical device according to claim 8, wherein the three-dimensional photonic crystal has a linear defect and a point defect and the linear defects and the point defect form an optical input/output circuit configured to operate at a plurality of wavelengths.

14. The optical device according to claim 8, wherein the sub-regions have point defects containing a luminescent material and emit light beams with different wavelengths.

15. The optical device according to claim 14, configured to operate as a laser device emitting light beams with different wavelengths in the infrared band.

16. The optical device according to claim 14, configured to operate as a laser device emitting light beams with different wavelengths in the visible band.

17. The optical device according to claim 16, wherein the laser device emits a red beam, a green beam, and a blue beam.

18. An optical device configured to operate as a color filter operating at a plurality of wavelengths, comprising the three-dimensional photonic crystal according to claim 1.

* * * * *